(12) United States Patent
Kanazawa et al.

(10) Patent No.: US 12,566,287 B2
(45) Date of Patent: Mar. 3, 2026

(54) LIGHT SOURCE DEVICE

(71) Applicant: NICHIA CORPORATION, Anan (JP)

(72) Inventors: Tatsuya Kanazawa, Anan (JP);
Masanobu Tanaka, Anan (JP)

(73) Assignee: NICHIA CORPORATION, Anan (JP)

( * ) Notice: Subject to any disclaimer, the term of this
patent is extended or adjusted under 35
U.S.C. 154(b) by 698 days.

(21) Appl. No.: 17/964,999

(22) Filed: Oct. 13, 2022

(65) Prior Publication Data

US 2023/0121969 A1 Apr. 20, 2023

(30) Foreign Application Priority Data

Oct. 19, 2021 (JP) ................................. 2021-171108

(51) Int. Cl.
| | |
|---|---|
| *G02B 6/42* | (2006.01) |
| *F21V 8/00* | (2006.01) |
| *G02B 19/00* | (2006.01) |
| *H01S 5/02253* | (2021.01) |

(Continued)

(52) U.S. Cl.
CPC ......... *G02B 6/0006* (2013.01); *G02B 6/4214*
(2013.01); *G02B 19/0028* (2013.01); *G02B
19/0057* (2013.01); *H01S 5/02253* (2021.01);
*H01S 5/02255* (2021.01); *H01S 5/4075*
(2013.01)

(58) Field of Classification Search
CPC .............. H01S 5/4075; H01S 5/02253; H01S
5/02255; G02B 19/0057; G02B 19/0028;
G02B 6/4214; G02B 6/0006
See application file for complete search history.

(56) References Cited

U.S. PATENT DOCUMENTS

| | | | | |
|---|---|---|---|---|
| 5,416,669 A | * | 5/1995 | Kato | F21S 41/24 |
| | | | | 362/23.15 |
| 6,240,116 B1 | * | 5/2001 | Lang | G02B 27/0977 |
| | | | | 372/50.23 |
| 2002/0063913 A1 | | 5/2002 | Nakamura et al. | |

(Continued)

FOREIGN PATENT DOCUMENTS

| | | |
|---|---|---|
| CN | 104756008 A | 7/2015 |
| CN | 111381378 A | 7/2020 |

(Continued)

*Primary Examiner* — Jessica S Manno
(74) *Attorney, Agent, or Firm* — Foley & Lardner LLP

(57) ABSTRACT

A light source device includes: light-emitting portions
arranged at least along an arrangement direction; one or
more optical members including a first reflective surface and
a second reflective surface, and configured to reflect light
emitted from the plurality of light-emitting portions and emit
the light in a predetermined direction; and a condenser lens
configured to condense the light emitted from the one or
more optical members. The first reflective surface is con-
figured to reflect the light emitted from the plurality of
light-emitting portions toward the second reflective surface.
The second reflective surface is configured to reflect the
light reflected by the first reflective surface. Each of the first
reflective surface and the second reflective surface is a
surface having a curvature in the arrangement direction. The
curvature of the second reflective surface in the arrangement
direction is greater than the curvature of the first reflective
surface in the arrangement direction.

8 Claims, 22 Drawing Sheets

(51) Int. Cl.
| | |
|---|---|
| *H01S 5/02255* | (2021.01) |
| *H01S 5/40* | (2006.01) |

(56) References Cited

U.S. PATENT DOCUMENTS

| | | | |
|---|---|---|---|
| 2005/0018321 A1 | 1/2005 | Takahashi | |
| 2013/0230064 A1 | 9/2013 | Tanaka et al. | |
| 2014/0111775 A1 | 4/2014 | Nishikawa et al. | |
| 2015/0234265 A1 | 8/2015 | Takamatsu et al. | |
| 2016/0091785 A1 | 3/2016 | Inoko et al. | |
| 2016/0259234 A1 | 9/2016 | Akiyama | |
| 2017/0307969 A1 | 10/2017 | Kawasumi et al. | |
| 2017/0329209 A1 | 11/2017 | Tajiri | |
| 2018/0299756 A1 | 10/2018 | Maeda et al. | |
| 2018/0335582 A1* | 11/2018 | Ishige ................... | H01S 5/4081 |
| 2019/0049075 A1 | 2/2019 | Ishige et al. | |
| 2020/0278641 A1* | 9/2020 | Kondo ................. | G03H 1/0005 |
| 2020/0400277 A1 | 12/2020 | Mori et al. | |
| 2023/0059013 A1* | 2/2023 | Hata ......................... | G02B 6/42 |
| 2023/0198220 A1* | 6/2023 | Nakazumi ............ | H01S 5/0607 |
| | | | 372/50.124 |
| 2024/0142084 A1* | 5/2024 | Namie ................. | G02B 6/4214 |

FOREIGN PATENT DOCUMENTS

| | | | |
|---|---|---|---|
| CN | 112091420 A | 12/2020 | |
| JP | 2002-107658 A | 4/2002 | |
| JP | 2002-310797 A | 10/2002 | |
| JP | 2004-013107 A | 1/2004 | |
| JP | 2004-348041 A | 12/2004 | |
| JP | 2005-268780 A | 9/2005 | |
| JP | 2013-179247 A | 9/2013 | |
| JP | 2014-082144 A | 5/2014 | |
| JP | 2016-071353 A | 5/2016 | |
| JP | 2016-109849 A | 6/2016 | |
| JP | 2016-162575 A | 9/2016 | |
| JP | 2017-227809 A | 12/2017 | |
| JP | 2020-204734 A | 12/2020 | |
| JP | 2021-036259 A | 3/2021 | |
| WO | WO-2013/118272 A1 | 8/2013 | |
| WO | WO-2014/073152 A1 | 5/2014 | |
| WO | WO-2016/067822 A1 | 5/2016 | |
| WO | WO-2016/185860 A1 | 11/2016 | |
| WO | WO-2016/185861 A1 | 11/2016 | |

* cited by examiner

FIG.5
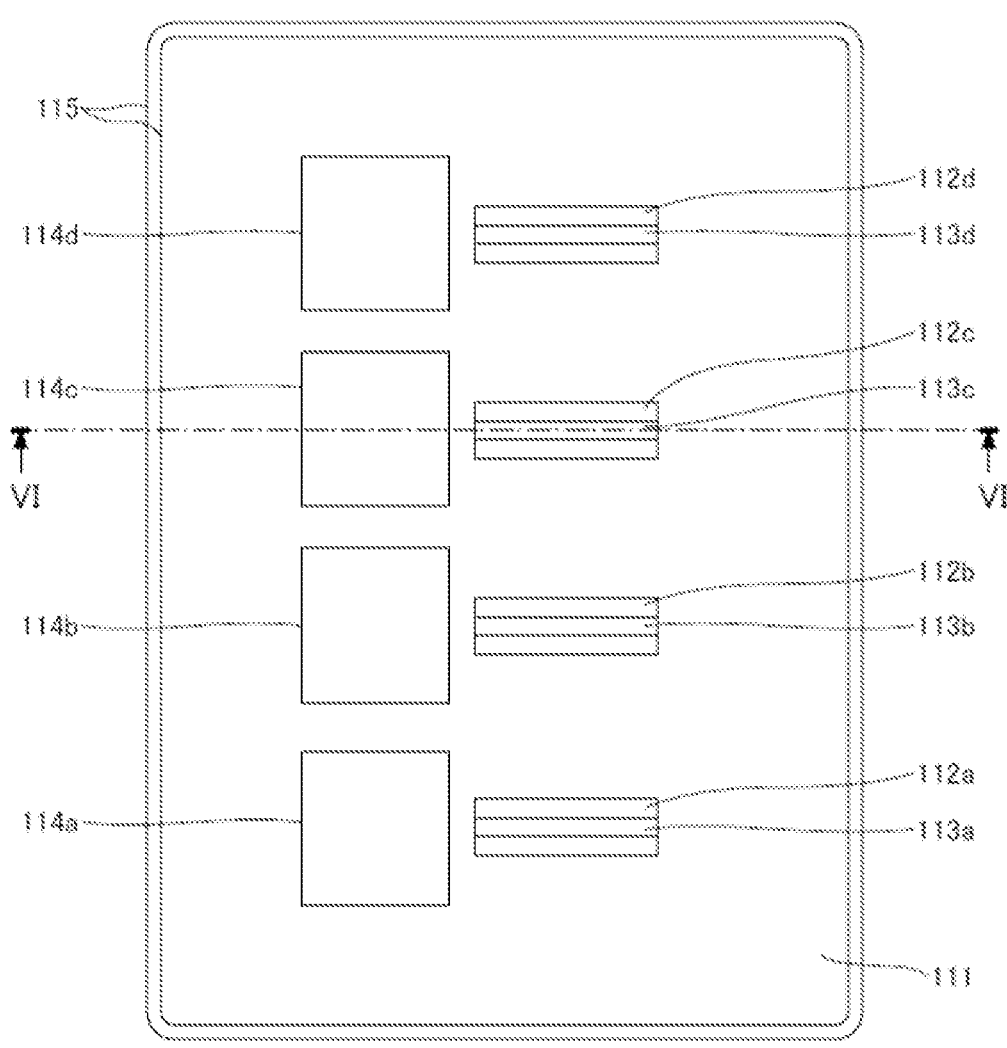

100b

F I G . 2 0
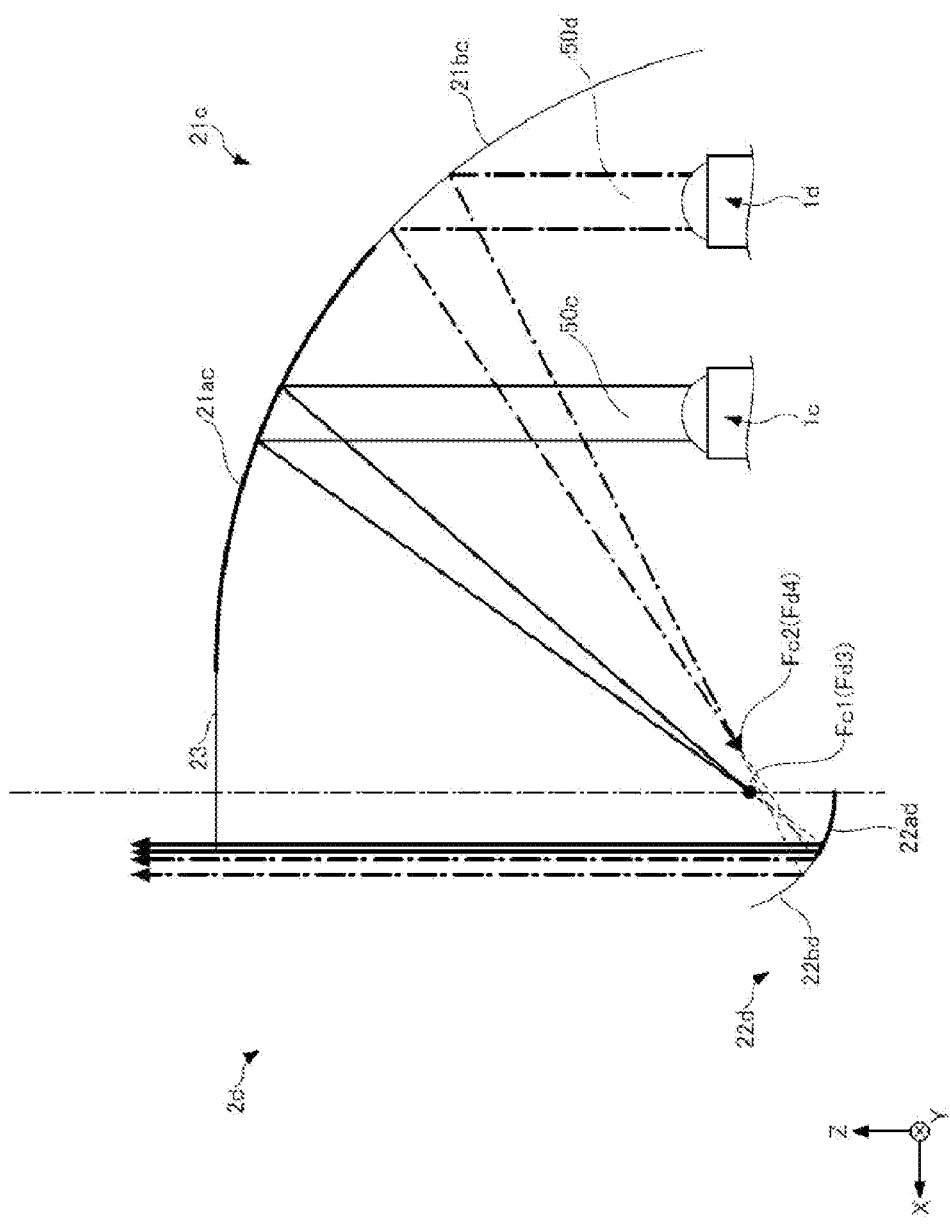

LIGHT SOURCE DEVICE

CROSS-REFERENCE TO RELATED APPLICATION

This application claims priority to Japanese Patent Application No. 2021-171108, filed on Oct. 19, 2021, the disclosure of which is hereby incorporated by reference in its entirety.

BACKGROUND

The present disclosure relates to a light source device.

Recently, a light source device including a semiconductor laser or a light-emitting diode has been widely used. For example, PCT Publication No. WO 2014-073152 discloses a configuration including one or more solid-state light sources disposed on a rear side of an emission portion that can emit light in a predetermined wavelength range along an optical axis direction and emit light in the predetermined wavelength range along the same direction as the optical axis direction, and a condensing optical system that condenses the light in the predetermined wavelength range emitted from the one or more solid-state light sources on a light emitter from the rear side of the emission portion.

SUMMARY

A light source device is required to have good light condensing properties.

An object of certain embodiments of the present disclosure is to provide a light source device having good light condensing properties.

A light source device according to an embodiment of the present disclosure includes a plurality of light-emitting portions, one or a plurality of optical members, and a condenser lens. The plurality of light-emitting portions are arranged at least along an arrangement direction. The one or a plurality of optical members comprises a first reflective surface and a second reflective surface, and are configured to reflect light emitted from the plurality of light-emitting portions and emit the light in a predetermined direction. The condenser lens is configured to condense the light emitted from the one or the plurality of optical members. The first reflective surface is configured to reflect the light emitted from the plurality of light-emitting portions toward the second reflective surface. The second reflective surface is configured to reflect the light reflected by the first reflective surface. Each of the first reflective surface and the second reflective surface is a surface having a curvature in the arrangement direction. The curvature of the second reflective surface in the arrangement direction is greater than the curvature of the first reflective surface in the arrangement direction.

According to certain embodiments of the present disclosure, a light source device having good light condensing properties can be provided.

BRIEF DESCRIPTION OF THE DRAWINGS

FIG. 5 is a top view of a configuration example of the array light-emitting portion included in the light source device according to the embodiment.

FIG. 20 is a view illustrating a second example of reflection by the parabolic mirror according to the second embodiment.

DETAILED DESCRIPTION

Figure 1:
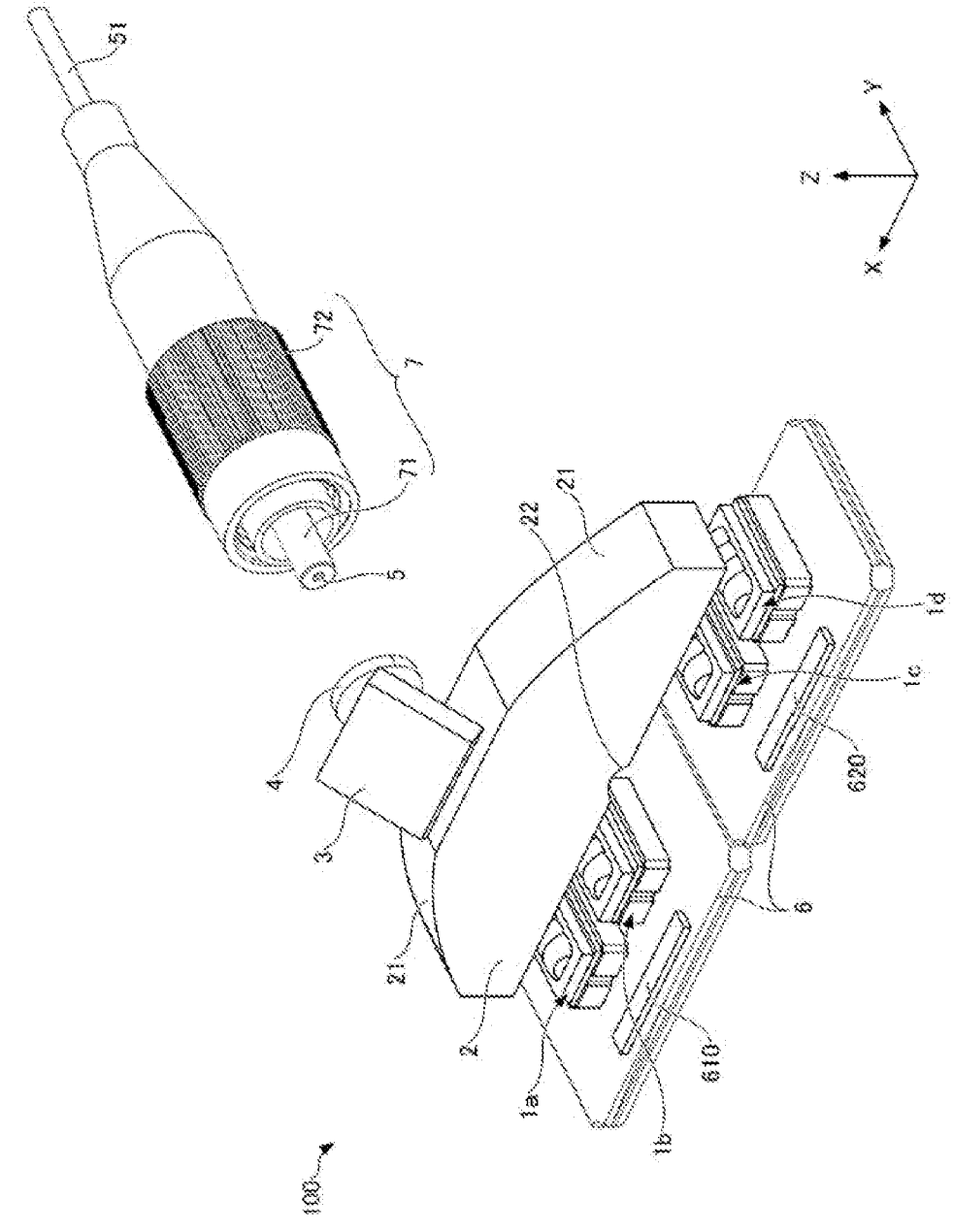
FIG. 1 is a perspective view illustrating a configuration example of a light source device according to a first embodiment.

A light-emitting device according to an embodiment of the present disclosure will be described in detail with reference to the drawings. The following embodiments illustrate a light source device for embodying the technical concept of the present embodiment, but the present embodiment is not limited to the description below. In addition, dimensions, materials, shapes, relative arrangements, or the like of constituent members described in the embodiments are not intended to limit the scope of the present invention, unless otherwise specified, and are merely exemplary. Note that the size, positional relationship, or the like of members illustrated in the drawings may be exaggerated for clarity of description. Further, in the following description, members having the same terms and reference characters represent the same members or members of the same quality, and a detailed description of these members will be omitted as appropriate.

In the drawings illustrated below, the X-axis, Y-axis, and Z-axis may indicate directions. The X direction along the X-axis indicates an arrangement direction in which a plurality of array light-emitting portions included in the light source device according to the embodiment are arranged. The Y direction along the Y-axis indicates an orthogonal direction substantially orthogonal to the arrangement direction. The Z direction along the Z-axis indicates a direction orthogonal to each of the arrangement direction and the orthogonal direction.

Further, the direction in the X direction in which the arrow faces is the +X direction and the opposite direction to the +X direction is the –X direction, the direction in the Y direction in which the arrow faces is the +Y direction and the opposite direction to the +Y direction is the –Y direction. The direction in the Z direction in which the arrow faces is the +Z direction and the opposite direction to the +Z direction is the –Z direction. In addition, the +Y direction is referred to as a front face side, and the –Y direction is referred to as a rear face side, and the +Z direction is referred to an upper face side. Also, the expression "in a plan view" used in the embodiment refers to viewing the object from the Z direction. However, these expressions do not limit the orientation of the light source device during use, and the orientation of the light source device may be any chosen orientation.

The term "substantially" in the above-described term "substantially orthogonal" does not require strict orthogonality, and means that a deviation from orthogonality to a degree generally recognized as a tolerance is acceptable. Similarly, the term "substantially" in the terms "substantially aligned," "substantially collimated," etc. described in the following embodiments does not require strictness, and means that a deviation to a degree generally recognized as a tolerance is acceptable.

First Embodiment

Configuration Example of Light Source Device 100

Figure 2:
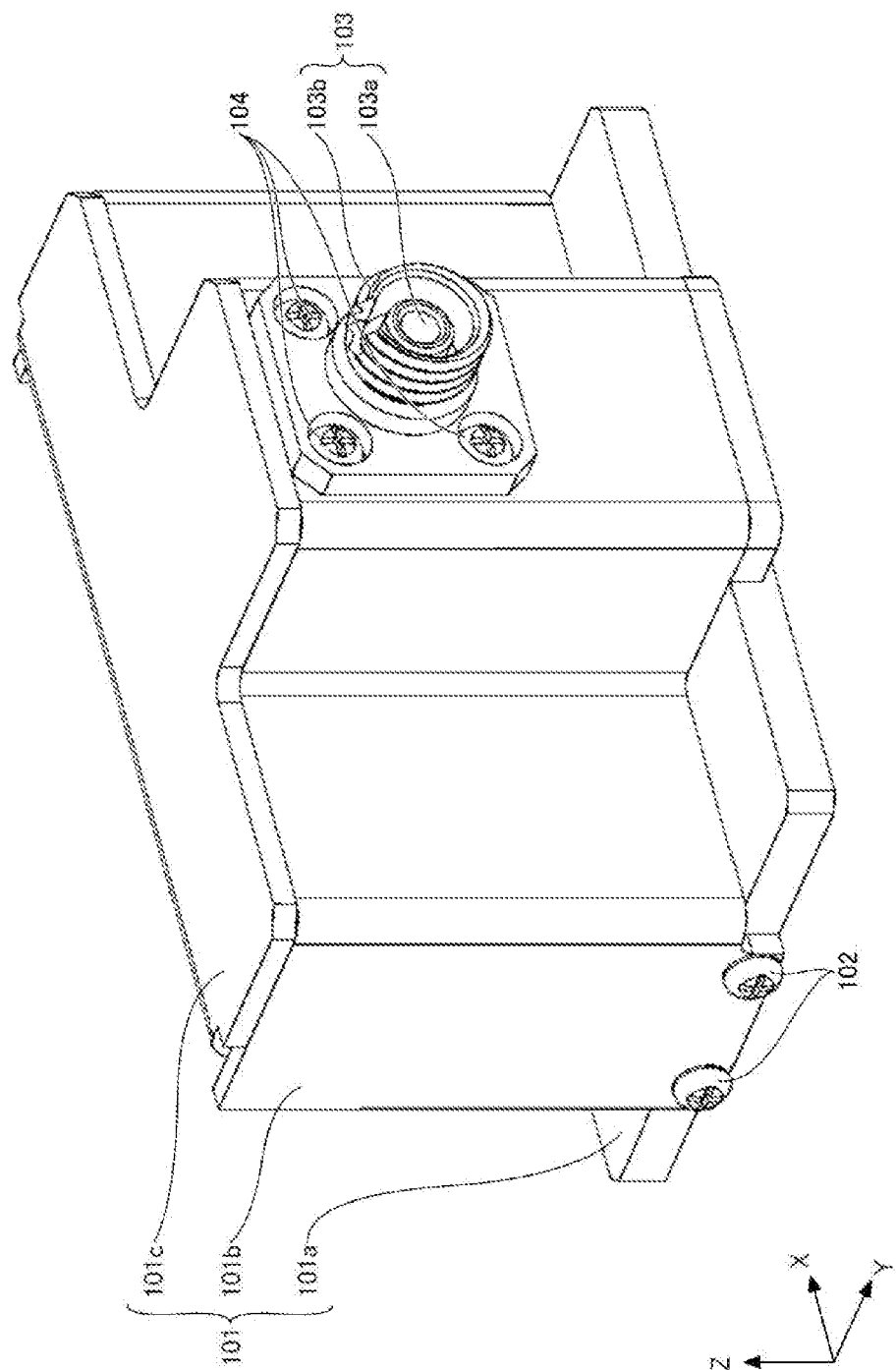
FIG. 2 is a perspective view of a housing that can accommodate the light source device according to the embodiment as viewed from a front face side.
Figure 3:
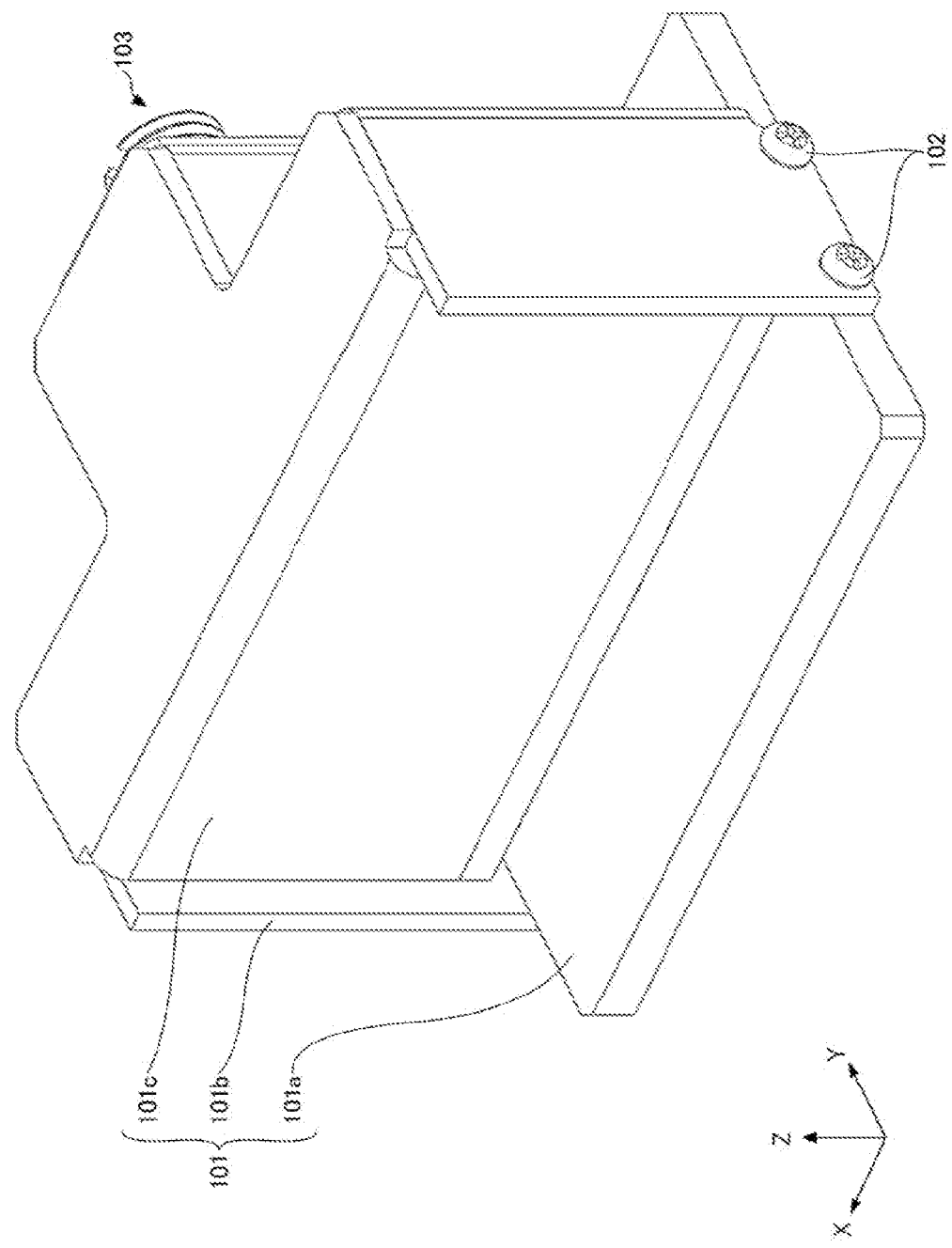
FIG. 3 is a perspective view of a housing that can accommodate the light source device according to the embodiment as viewed from a rear face side.

An overall configuration of a light source device 100 according to a first embodiment will be described with reference to FIGS. 1 to 3. FIG. 1 is a diagram illustrating an example of a configuration of the light source device 100, and is a perspective view of the light source device 100 as viewed from a rear face side in a state in which a housing 101 covering the light source device 100 is removed. FIGS. 2 and 3 are diagrams illustrating the light source device 100 in a state in which the housing 101 is attached, FIG. 2 is a perspective view of the light source device 100 as viewed from the front face side, FIG. 3 is a perspective view of the light source device 100 as viewed from the rear face side.

As illustrated in FIG. 1, the light source device 100 includes an array light-emitting portion 1a, an array light-emitting portion 1b, an array light-emitting portion 1c, an array light-emitting portion 1d, a parabolic mirror 2, a stepped mirror 3, and a condenser lens 4. In the light source device 100 the light emitted by each of the array light-emitting portion 1a, the array light-emitting portion 1b, the array light-emitting portion 1c, and the array light-emitting portion 1d is reflected by each of the parabolic mirror 2 and the stepped mirror 3, condensed by the condenser lens 4, and caused to be incident on a core of an optical fiber 5.

The array light-emitting portion 1a, the array light-emitting portion 1b, the array light-emitting portion 1c, and the array light-emitting portion 1d are arranged along the X direction, and are each provided on a surface on the +Z direction side of a light-emitting portion mounting substrate 6. Because the array light-emitting portion 1a, the array light-emitting portion 1b, the array light-emitting portion 1c, and the array light-emitting portion 1d all have the same functions, they are collectively referred to as an array light-emitting portion 1 unless otherwise specified.

Each of the array light-emitting portion 1a, the array light-emitting portion 1b, the array light-emitting portion 1c, and the array light-emitting portion 1d has a plurality of light-emitting portions arranged along the Y direction, and emits a plurality of laser beams arranged along the Y direction. The laser beam emitted by the array light-emitting portion 1 is an example of each of the light and the laser light emitted by the light-emitting portion.

The light-emitting portion included in the array light-emitting portion 1 is, for example, a semiconductor laser element. However, the light-emitting portion is not limited thereto, and may be a light-emitting element other than a semiconductor laser element, such as a Light Emitting Diode (LED).

In the present embodiment, the laser beam means a flux of laser rays in which the laser rays are collected, and can also be referred to as a laser ray flux. Furthermore, because the light emitted by the light-emitting portion is not limited to the laser light, it can be said that the light-emitting portion emits a light beam flux which is a collection of light beams.

The light-emitting portion mounting substrate 6 is a plate-like member with a substantially rectangular shape in a plan view, and is a substrate on which a light-emitting element or various electrical elements can be mounted and can be provided with wiring. However, the shape of the light-emitting portion mounting substrate 6 is not limited thereto. An electrical connector 610 and an electrical connector 620 are provided on a surface of the light-emitting portion mounting substrate 6 on the +Z direction side. A drive current or drive voltage for driving the light-emitting portion included in the array light-emitting portion 1 is supplied via each of the electrical connector 610 and the electrical connector 620. In the present embodiment, the light-emitting portion mounting substrate 6 in which two plate-like members are coupled along the X direction is exemplified, but the present invention is not limited thereto, and the light-emitting portion mounting substrate 6 may be configured by one plate-like member, or may be configured by three or more plate-like members.

The parabolic mirror 2 and the stepped mirror 3 correspond to a plurality of optical members that include a first reflective surface 21 and a second reflective surface 22, and reflect, in the +Y direction, laser beams from a plurality of light-emitting portions included in the array light-emitting portion 1. Further, the parabolic mirror 2 corresponds to a first optical member integrally including a first reflective surface 21 and a second reflective surface 22. The stepped mirror 3 corresponds to a second optical member having a stepped reflective surface.

In other words, in the present embodiment, the plurality of optical members are two optical members including the parabolic mirror 2 and the stepped mirror 3. The +Y direction in which the two optical members including the parabolic mirror 2 and the stepped mirror 3 reflect the laser beam is an example of the predetermined direction.

The condenser lens 4 collects the laser beam incident from the stepped mirror 3 and causes the laser beam incident on the core of the optical fiber 5. The condenser lens 4 includes a glass or resin having transmissivity with respect to a wavelength of the laser beam emitted by the array light-emitting portion 1. Examples of the glass include quartz and BK7. From the viewpoint of suppressing damage due to light energy, the condenser lens 4 preferably includes a glass material. In the present embodiment, the condenser lens 4, which is a single lens, is illustrated, but the condenser lens 4 may include a lens group in which a plurality of lenses are combined. The condenser lens 4 may be a spherical lens or an aspherical lens, or may be a flat convex lens, a meniscus lens, a biconvex lens, or a combination thereof.

The light source device 100 includes the optical fiber 5 connected to the light source device 100 via an optical connector 7. The optical connector 7 is attached to an end portion on the −Y direction side of the optical fiber 5, and includes a ferrule 71, a housing 72, etc., and holds the optical fiber 5 by the housing 72 in a state in which the end portion on the −Y direction side of the optical fiber 5 is fixed to the ferrule 71. The optical fiber 5 is covered with a covering member 51 at a portion other than a portion to which the optical connector 7 is attached in the optical fiber 5. The covering member 51 protects the optical fiber 5 by suppressing breakage or damage of the optical fiber 5, adhesion of dust to the optical fiber 5, etc.

The optical connector 7 is a member for allowing light to pass therethrough to mechanically couple and to be aligned with the core of the optical fiber 5. The optical connector 7 is, for example, an FC connector, an SC connector, an ST connector, an LC connector, an MU connector, etc. The optical fiber 5 is connected to the light source device 100 via the optical connector 7, thereby suppressing light loss associated with misalignment of the core in the optical fiber 5.

In the present embodiment, the light source device 100 is used in a state of being accommodated in the housing 101 illustrated in FIGS. 2 and 3. Note that the light source device 100 is not necessarily accommodated in the housing 101 when used, but is preferably used in a state of being accommodated inside the housing 101 from the viewpoint of suppressing adhesion of dust to the array light-emitting portion 1, the parabolic mirror 2, the stepped mirror 3, the condenser lens 4, etc. Also, the housing may be a portion of the light source device 100.

The array light-emitting portion 1a, the array light-emitting portion 1b, the array light-emitting portion 1c, and the array light-emitting portion 1d are mounted on a surface on the +Z direction side of the light-emitting portion mounting substrate 6. The parabolic mirror 2, the stepped mirror 3, and the condenser lens 4 are held by a holding member, and are accommodated inside the housing 101 in a state of being fixed to the light-emitting portion mounting substrate 6 via the holding member. Note that each of the parabolic mirror 2, the stepped mirror 3, and the condenser lens 4 may be fixed to the housing 101 via the holding member.

The housing 101 includes a base member 101a, a cover member 101b, a cover member 101c, and a connecting member 103. The cover member 101b and the cover member 101c are coupled to the base member 101a by a screw member 102. The light source device 100 is fixed to a surface on the +Z direction side of the base member 101a, and is accommodated inside the housing 101 so as to be covered around the cover members 101b and 101c.

The connecting member 103 is used to connect the optical connector 7 to the light source device 100. The connecting member 103 includes a ferrule insertion hole 103a and a screw portion 103b, and is fixed to the +Y direction side of the cover member 101b by a screw member 104.

The ferrule 71 is inserted into the ferrule insertion hole 103a, and the screw portion provided in the housing 72 of the optical connector 7 and the screw portion 103b of the connecting member 103 are coupled to each other, whereby the optical connector 7 is connected to the light source device 100.

The central axis of the ferrule insertion hole 103a and the central axis of the ferrule 71 are aligned, and the ferrule 71 is inserted into the ferrule insertion hole 103a to position the core of the optical fiber 5.

The condenser lens 4 in the light source device 100 is positioned so that the position of the core of the optical fiber 5 attached to the housing 101 via the optical connector 7 is aligned with the position where the laser beam is condensed by the condenser lens 4. Therefore, the light source device 100 can cause the laser beams emitted from the plurality of array light-emitting portions 1 to be incident on the core of the optical fiber 5 by condensing the laser beams with the condenser lens 4.

The laser beam incident on the core of the optical fiber 5 and guided in the optical fiber 5 is emitted from an end portion on the side opposite to an end portion on which the optical connector 7 in the optical fiber 5 is attached, and is utilized for the lighting application, etc. The light source device 100 is utilized for lighting, an on-vehicle headlight, an optical measuring instrument, an optical processing device, various optical devices, etc. However, the application of the light source device 100 is not limited to these applications.

Configuration Example of Array Light-Emitting
Portion 1

Figure 4:
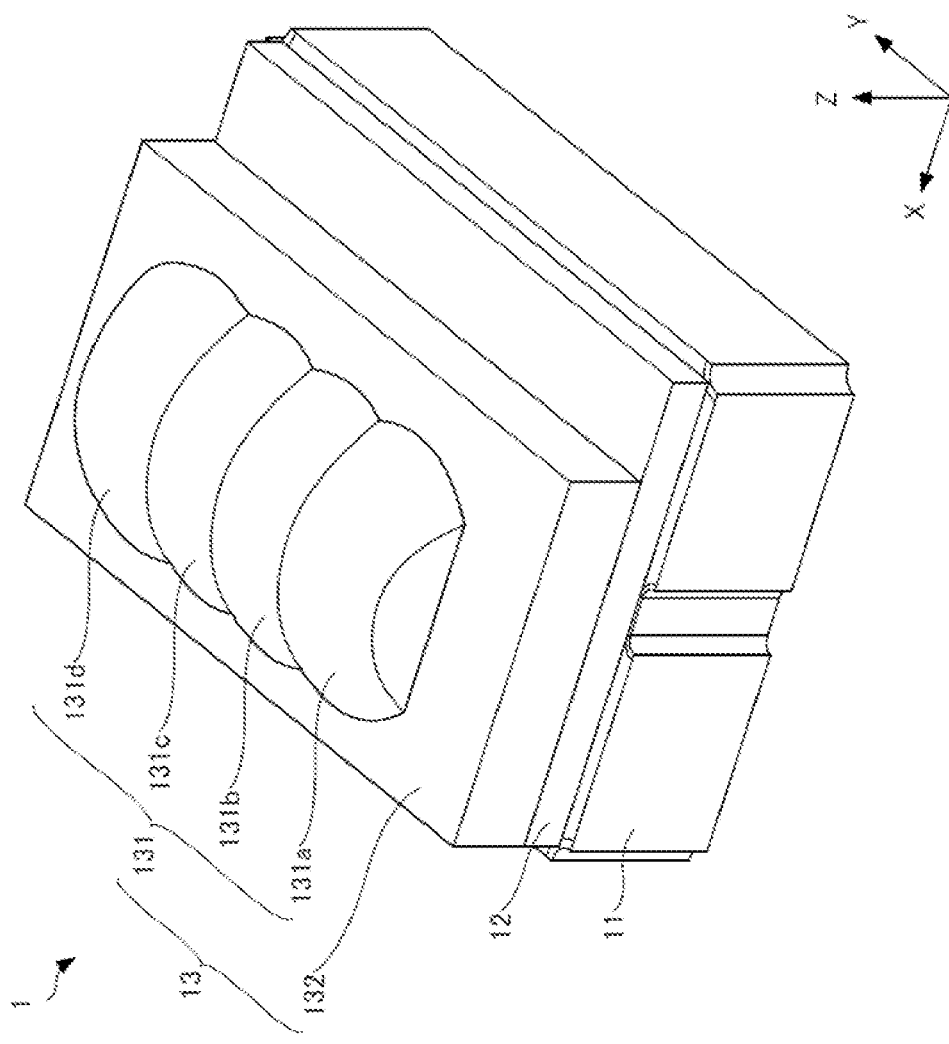
FIG. 4 is a perspective view of an array light-emitting portion included in the light source device according to the embodiment.
Figure 6:
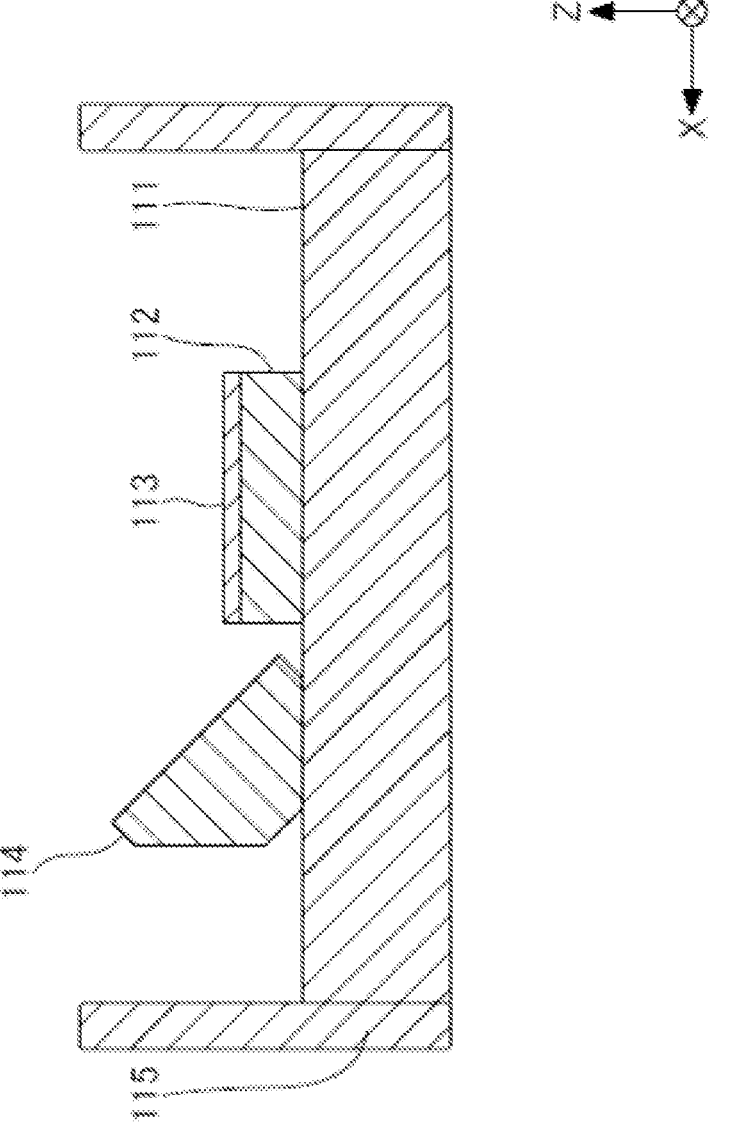
FIG. 6 is a cross-sectional view taken along line VI-VI in FIG. 5.

FIGS. 4 and 6 are diagrams illustrating the configuration of the array light-emitting portion 1. FIG. 4 is a perspective view of the array light-emitting portion 1. FIG. 5 is a top view illustrating an example of the configuration of the array light-emitting portion 1. FIG. 6 is a cross-sectional view taken along line VI-VI in FIG. 5 as viewed from the −Y direction side.

As illustrated in FIGS. 4 to 6, the array light-emitting portion 1 includes a package 11, a light-transmissive member 12, and a lens array 13. The package 11 includes a bottom portion 111 and a side wall portion 115. Four submounts 112, four light-emitting portions 113, and four light reflecting members 114 are provided in the package 11.

The package 11 is mounted on a surface on the +Z direction side of the light-emitting portion mounting substrate 6, and the light-transmissive member 12 is disposed on the +Z direction side of the package 11, and the lens array 13 is disposed on the +Z direction side of the light-transmissive member 12.

A submount 112a, a submount 112b, a submount 112c, and a submount 112d are collectively referred to as the submount 112. A light-emitting portion 113a, a light-emitting portion 113b, a light-emitting portion 113c, and a light-emitting portion 113d are collectively referred to as the light-emitting portion 113. A light reflecting member 114a, a light reflecting member 114b, a light reflecting member 114c, and a light reflecting member 114d are collectively referred to as the light reflecting member 114.

The light-emitting portion 113 is arranged along the Y direction, and is disposed on the +Z direction side surface of the submount 112 disposed on the +Z direction side surface of the bottom portion 111. The four light-emitting portions 113 emit laser beams toward the light reflecting members 114 corresponding to the light-emitting portions 113 in a one-to-one manner.

As the light-emitting portion 113, a portion that emits a laser beam having an emission peak wavelength in a visible light range from 380 nm to 780 nm can be used. Only a light-emitting portion emitting a laser beam having an emission peak wavelength in a range from 420 nm to 495 nm may be used. Alternatively, a light-emitting portion emitting a laser beam having an emission peak wavelength in a range from 495 nm to 570 nm may be used, or a light-emitting portion emitting a laser beam having an emission peak wavelength in a range from 605 nm to 750 nm may be used in combination with any of the portions. Also, the light-emitting portion emitting a laser beam in an invisible light region such as infrared light or ultraviolet light may be used. For example, a material including a nitride semiconductor is preferably used in the light-emitting portion 113. The nitride semiconductor includes at least one of GaN, InGaN, and AlGaN. For example, aluminum nitride or silicon carbide can be used for the submount 112.

The light reflecting member 114 is arranged along the Y direction so as to correspond to the light-emitting portion 113 in a one-to-one manner, and is disposed on the upper surface of the bottom portion 111. The light reflecting member 114 reflects the laser beam emitted by the light-emitting portion 113 in the +Z direction. The light reflecting member 114 may include a glass material such as quartz or BK7 as a main material, a heat-resistant metal material such as aluminum, silicon, etc., and a material having a high reflectivity such as a metal or a dielectric multilayer film can be used for the surface that reflects light.

The light-transmissive member 12 is provided between the package 11 and the lens array 13, and is a member that seals the interior of the package 11. For the light-transmissive member 12, for example, a glass material such as quartz or BK7, sapphire, or the like having a transmissivity with respect to the wavelength of the laser beam emitted by the light-emitting portion 113 can be used.

The lens array 13 is a member in which the four collimating lenses 131a, 131b, 131c, and 131d arranged along the Y direction are connected at a connection portion 132. If the collimating lenses 131a, 131b, 131c and 131d are not distinguished, they are collectively referred to as collimating lenses 131. The lens array 13 includes, for example, a glass material such as BK7 having transmissivity with respect to the wavelength of the laser light emitted by the light-emitting portion 113, and is produced by integrally molding, etc.

The laser beam emitted by the light-emitting portion 113 and reflected in the +Z direction by the light reflecting member 114 is incident on the lens array 13 after passing through the light-transmissive member 12.

The four collimating lenses 131 in the lens array 13 correspond to the light-emitting portions 113 in a one-to-one manner, substantially collimate (substantially parallelize) the incident laser light, and emit the laser light toward the parabolic mirror 2 disposed on the +Z direction side of the array light-emitting portion 1. Note that in the present embodiment, the substantially collimated laser beam is emitted, but the laser beam emitted from the array light-emitting portion 1 is not limited to the collimated light, and may be focused light or divergent light.

Each of the four array light-emitting portions 1 includes four light-emitting portions 113, and thus the light source device 100 includes a total of sixteen light-emitting portions 113 arranged along each direction in the X direction and the Y direction. The light source device 100 can emit sixteen laser beams.

However, the number of the array light-emitting portions 1 is not limited to four, and can be appropriately selected depending on the application of the light source device 100. Similarly, the number of light-emitting portions 113 included in each array light-emitting portion 1 is not limited to four as well, and can be appropriately selected depending on the application of the light source device 100.

The light-emitting portion 113 is not limited to being arranged in the two axial directions in the X direction and the Y direction, and may be arranged in one axial direction of either the X direction or the Y direction. The numbers of the submounts 112, the light reflecting members 114, and the collimating lenses 131 can be appropriately selected according to the number of the light-emitting portions 113.

Figure 7:
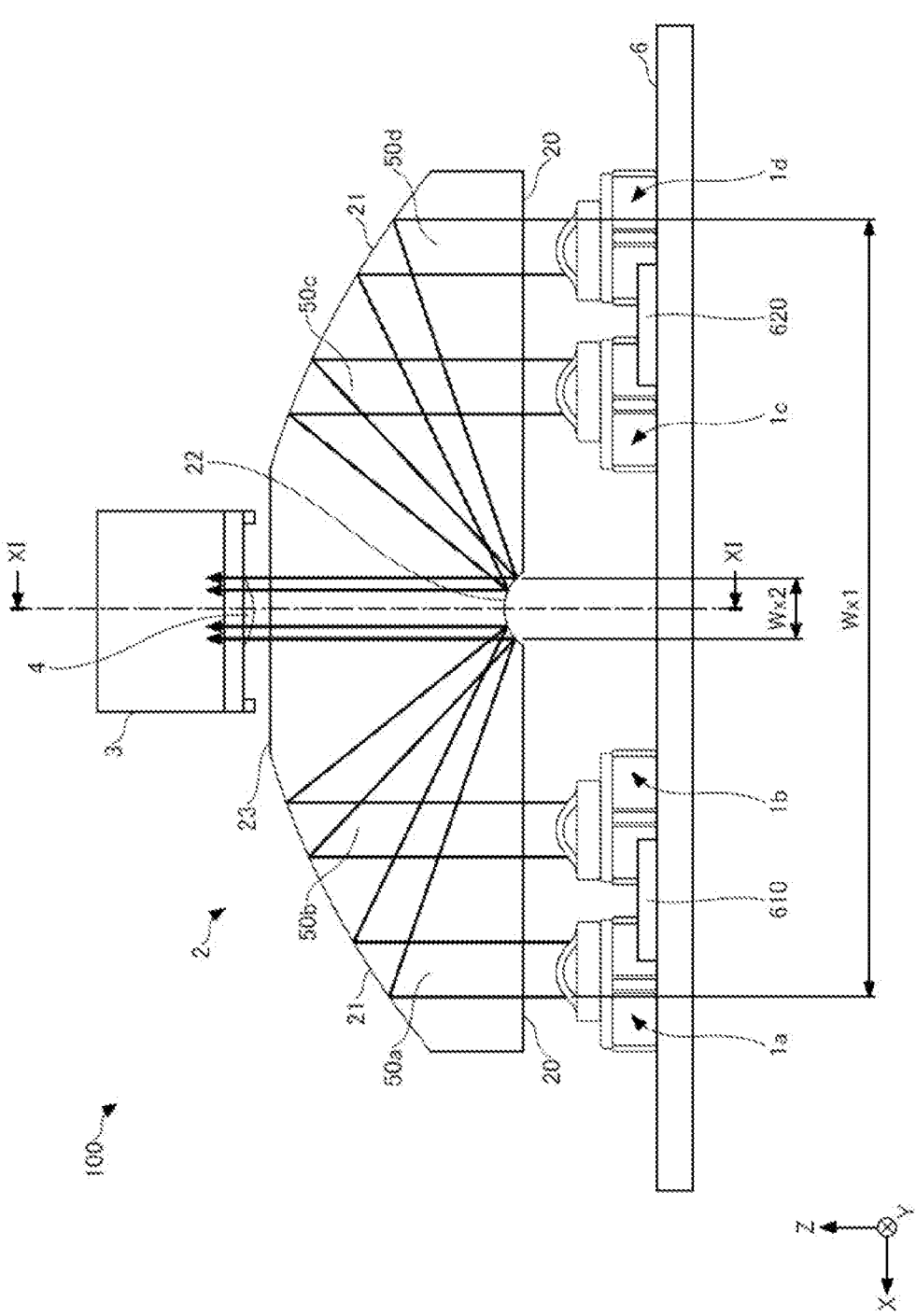
FIG. 7 is a rear view of a configuration example of a parabolic mirror included in the light source device according to the first embodiment.
Figure 8:
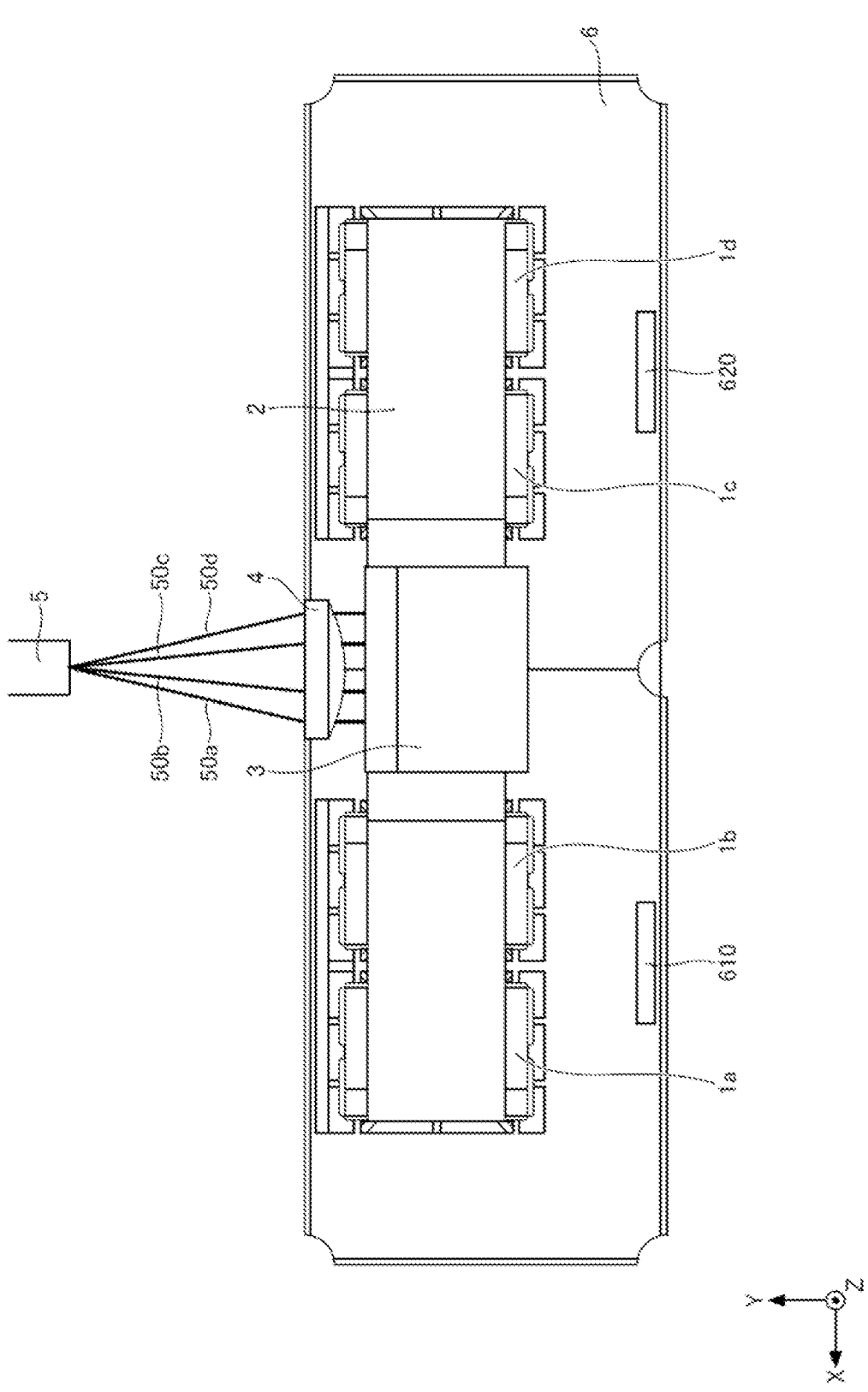
FIG. 8 is a top view of a configuration example of the parabolic mirror included in the light source device according to the first embodiment.
Figure 9:
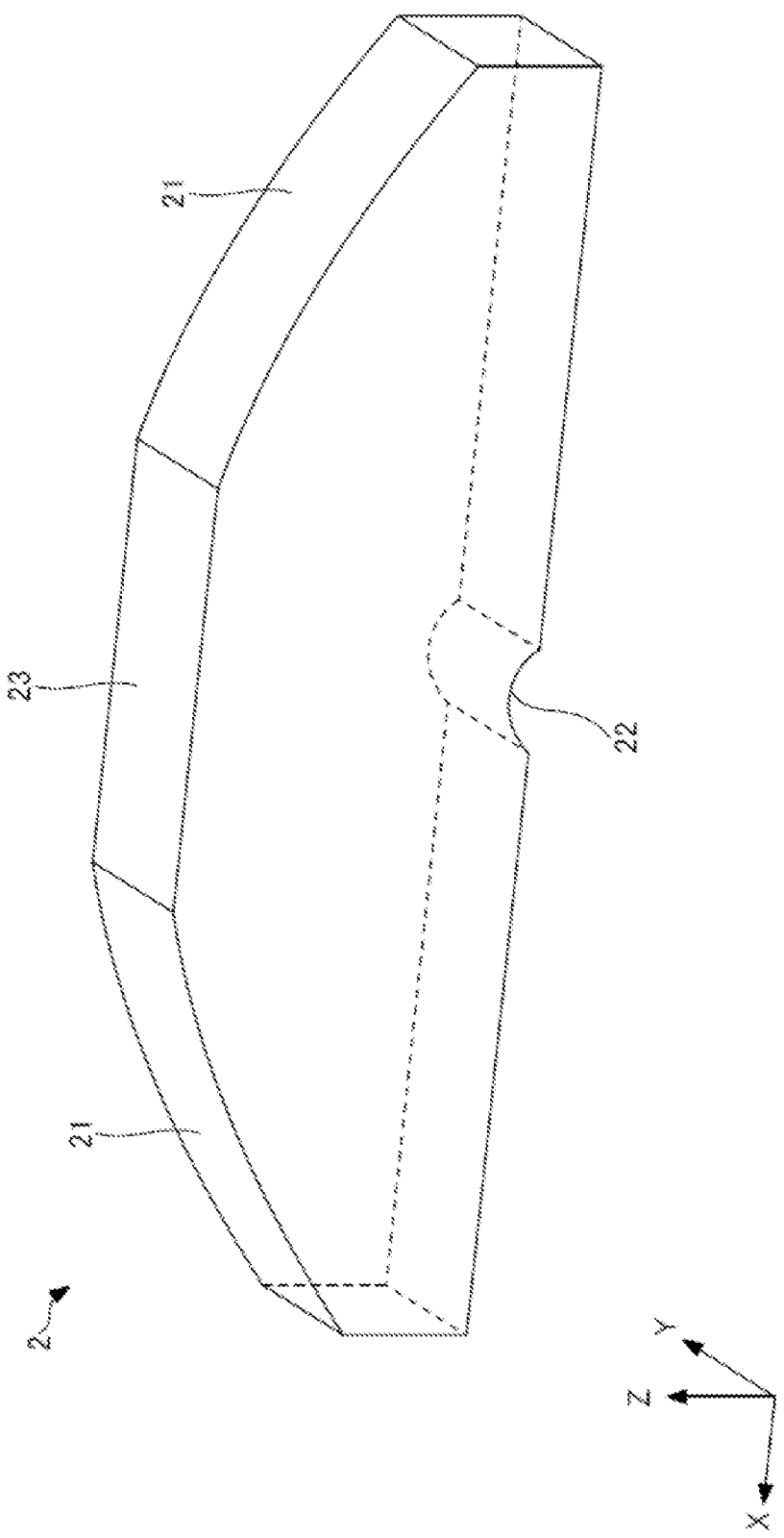
FIG. 9 is a perspective view of the parabolic mirror included in the light source device according to the first embodiment.
Figure 10:
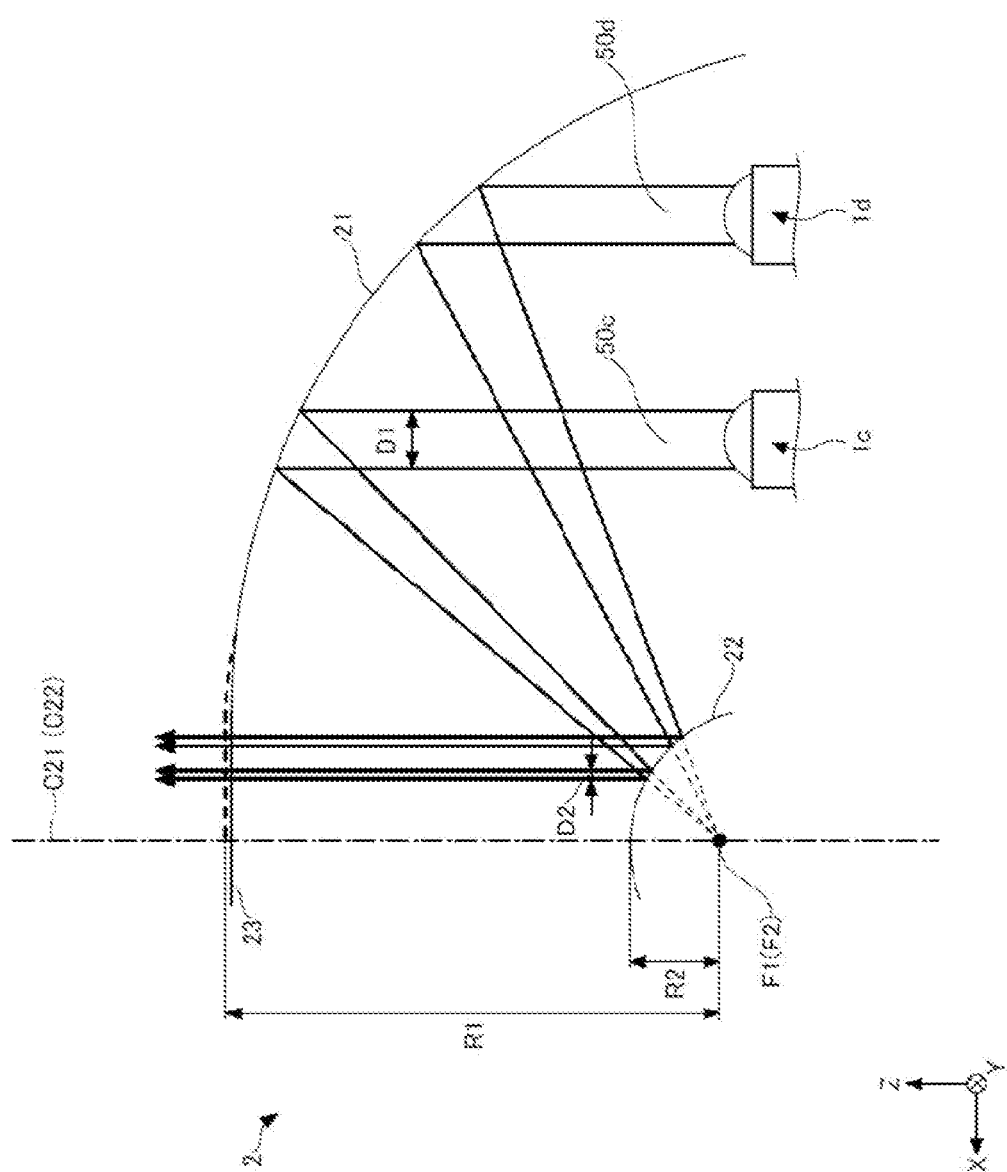
FIG. 10 is a view illustrating reflection by the parabolic mirror of the light source device according to the first embodiment.

Configuration and Function Example of Parabolic Mirror 2 FIGS. 7 to 10 are diagrams illustrating the configuration and function of the parabolic mirror 2. FIGS. 7 and 8 are diagrams illustrating the light source device 100 in a state in which the housing 101 is removed, and FIG. 7 is a rear view and FIG. 8 is a top view. FIG. 9 is a perspective view of the parabolic mirror 2. FIG. 10 is a diagram illustrating reflection by the parabolic mirror 2, and is a cross-sectional view of a portion of each of the first reflective surface 21 and the second reflective surface 22 in the parabolic mirror 2 as viewed from the −Y direction side.

As illustrated in FIG. 7, the parabolic mirror 2 includes an incident surface 20, the first reflective surface 21, the second reflective surface 22, and an emission surface 23.

The parabolic mirror 2 includes, for example, a glass such as quartz or BK7 or resin having transmissivity with respect to a wavelength of the laser beam emitted by the light-emitting portion 113. Because the parabolic mirror 2 guides and reflects the laser beam inside, it is preferable that the parabolic mirror 2 includes a glass material from the viewpoint of preventing damage due to light energy.

Each of the incident surface 20 and the emission surface 23 is a flat surface. In the X direction, the second reflective surface 22 is provided in a portion sandwiched between two incident surfaces 20. In addition, in the X direction, the emission surface 23 is provided in a portion sandwiched between two first reflective surfaces 21.

Each of the first reflective surface 21 and the second reflective surface 22 has a curvature in the X direction, and is part of a cylindrical surface having substantially no curvature in the Y direction. Here, "having substantially no curvature" refers to a range including a tolerance that can normally occur when the curvature is 0 or when the curvature is designed to be 0. The first reflective surface 21 and the second reflective surface 22 each have a parabolic surface shape in the X direction.

The parabolic surface shape in the X direction means a parabolic line shape included in a cross-sectional shape when a surface is cut by a plane parallel to a plane including each of the X-axis and the Z-axis. This also applies to the expression "spherical shape in the X direction" or "aspherical shape in the X direction."

The first reflective surface 21 and the second reflective surface 22 are not limited to a surface having a parabolic surface shape in the X direction, and may be a surface having a spherical shape in the X direction, or a surface having an aspherical shape other than the parabolic surface shape in the X direction, etc. In a surface having an aspherical shape such as a parabolic surface in the X direction, the surface curvature differs depending on the position in the X direction. The curvature of such a surface refers to the curvature (paraxial curvature) in a region near the central axis of the surface.

Each of the first reflective surface 21 and the second reflective surface 22 is provided with a heat-resistant metal material such as aluminum on the surface thereof, and reflects a laser beam incident thereon. The metal material provided on the surface can be appropriately selected depending on the wavelength or the like of the laser beam emitted by the light-emitting portion 113. Instead of a metal material, a dielectric multilayer film may be provided on the surface. The metal material or the dielectric multilayer film provided on the surface is preferably a material having a high reflectivity. The reflectivity is preferably 70% or more of the incident laser beam, more preferably 80% or more of the incident laser beam, and still more preferably 90% or more of the incident laser beam.

The first reflective surface 21 and the second reflective surface 22 are not limited to a configuration in which the metal material is provided on the surface, and may be a configuration in which the incident laser beam is totally reflected by the first reflective surface 21 and the second reflective surface 22. In this case, the first reflective surface 21 and the second reflective surface 22 are produced so as to satisfy the total reflection condition, and may not have a metal material on the surface.

The first reflective surface 21 includes two regions, that is, a region on the +X direction side and a region on the −X direction side, which are disposed with the emission surface 23 interposed therebetween at a central portion in the X direction. The two regions include a parabolic surface shape having the same curvature in the X direction.

In FIG. 7, each of the four array light-emitting portions 1 arranged along the X direction emits a substantially collimated laser beam toward the +Z direction side. In FIG. 7, a laser beam 50a emitted by the array light-emitting portion 1a, a laser beam 50b emitted by the array light-emitting portion 1b, a laser beam 50c emitted by the array light-emitting portion 1c, and a laser beam 50d emitted by the array light-emitting portion 1d are represented by thick solid lines.

Further, FIG. 7 illustrates the laser beam emitted from one array light-emitting portion 1 by two thick solid lines. FIG. 8 illustrates a laser beam emitted from one array light-emitting portion 1 by one thick solid line. Hereinafter, when the laser beam 50a, laser beam 50b, laser beam 50c, and laser beam 50d are not particularly distinguished, they are collectively referred to as a laser beam 50.

Each of the four array light-emitting portions 1 emits four laser beams arranged in the Y direction. In one array light-emitting portion 1, behaviors in which the four laser beams arranged in the Y direction are guided and reflected by the parabolic mirror 2 are the same as viewed from the Y direction side.

The laser beam 50a enters the interior of the parabolic mirror 2 through the incident surface 20, and then reaches the first reflective surface 21 after being guided inside the parabolic mirror 2. The laser beam 50a that has reached the first reflective surface 21 is reflected by the first reflective surface 21 toward the second reflective surface 22, is guided inside the parabolic mirror 2, and then reaches the second reflective surface 22. The laser beam 50a that has reached the second reflective surface 22 is reflected by the second reflective surface 22 toward the emission surface 23, is guided inside the parabolic mirror 2, and then emitted from the emission surface 23. The laser beam 50a emitted from the emission surface 23 enters the stepped mirror 3.

Each of the laser beam 50b, the laser beam 50c, and the laser beam 50d is incident on the stepped mirror 3 after being reflected by the parabolic mirror 2, similarly to the laser beam 50a.

In FIG. 7, an entire width Wx1 represents an entire width along the X direction of the plurality of laser beams 50 at positions where the laser beams 50 are incident on the first reflective surface 21. Further, an entire width Wx2 represents an entire width along the X direction of the plurality of laser beams 50 at positions where the laser beams 50 are reflected by the second reflective surface 22. Here, the width of one laser beam is referred to as the width of a portion having an intensity of $1/e^2$ or more with respect to a peak intensity value in the light intensity distribution of the laser beam at a position away from the emission end face.

As illustrated in FIG. 10, a curvature (1/R2) in the X direction of the second reflective surface 22 is greater than a curvature (1/R1) in the X direction of the first reflective surface 21. The curvature (1/R1) is a curvature of the first reflective surface 21 in a region near the central axis C21 that is the paraxial region. The curvature (1/R2) is a curvature of the second reflective surface 22 in a region near the central axis C22 that is the paraxial region. Note that in FIG. 10, the center axis C21 and the central axis C22 overlap with each other, and thus the reference numerals are collectively written.

A focal point F1 of the first reflective surface 21 overlaps with a focal point F2 of the second reflective surface 22. In other words, the focal point F1 is located at substantially the same position as the focal point F2. Here, "located at substantially the same position" refers to the distance between the focal point F1 and the focal point F2 within 0.05 mm.

The focal point refers to a point at which reflected light is collected when substantially collimated light is reflected. In FIG. 10, when the collimated light emitted in the +Z direction from the array light-emitting portion is incident on the first reflective surface 21, the point at which the collimated light is reflected and collected by the first reflective surface 21 is the focal point F1 of the first reflective surface 21. Further, when the collimated light is incident on the second reflective surface 22 from the concave surface side of the second reflective surface 22, the point at which the collimated light is reflected and collected by the second reflective surface 22 is the focal point F2 of the second reflective surface 22.

In the present embodiment, a configuration is exemplified in which the focal point F1 in the entire region excluding the emission surface 23 in the first reflective surface 21 overlaps with the focal point F2 in the entire region in the second reflective surface 22, but the present invention is not limited thereto. A configuration may be employed in which the focal point F1 in at least a portion of the first reflective surface 21 may overlap with the focal point F2 in at least a portion of the second reflective surface 22.

The first reflective surface 21 and the second reflective surface 22 each have a curvature in the X direction, and thus the laser beam 50c reflected by the first reflective surface 21 is focused in the X direction. Because the focal point F1 of the first reflective surface 21 and the focal point F2 of the second reflective surface are located at substantially the same position, the laser beam 50c reflected by the second reflective surface 22 is again substantially collimated after being reflected by the first reflective surface 21.

The first reflective surface 21 and the second reflective surface 22 constitute an afocal optical system on which the collimated light is incident and from which the collimated light is emitted. The curvature (1/R2) of the second reflective surface is greater than the curvature (1/R1) of the first reflective surface 21. Thus, a beam width D2 along the X direction of the laser beam 50c at the position reflected by the second reflective surface 22 is smaller than a beam width D1 along the X direction of the laser beam 50c at the position incident on the first reflective surface 21.

In other words, regarding the beam width along the X direction of the laser beam 50 emitted by the light-emitting portion 113, the beam width D2 at a position where the laser beam 50 is reflected by the second reflective surface 22 is smaller than the beam width D1 at a position where the laser beam 50 is incident on the first reflective surface 21. In particular, the beam width D2 is substantially equal to the beam width D1 multiplied by the ratio (R2/R1) of the curvatures (1/R2) and (1/R1). Also as illustrated in FIG. 7, the entire width Wx2 is smaller than the entire width Wx1. The ratio between the beam width D1 and the beam width D2, as well as the ratio between the entire width Wx1 and the entire width Wx2 can be changed as appropriate depending on the number of light-emitting portions, the core diameter of the optical fiber 5, etc.

In the present embodiment, because the laser beam 50c incident on the first reflective surface 21 is substantially collimated, the beam width D1 of the laser beam 50c is substantially equal regardless of the position in the optical path from the exit of the lens array 13 of the array light-emitting portion 1 to the incident on the first reflective surface 21. Similarly, because the laser beam 50c reflected by the second reflective surface 22 is also substantially collimated, the beam width D2 of the laser beam 50c is substantially the same regardless of the position in the optical path after being reflected by the second reflective surface 22 until it is incident on the stepped mirror 3.

Because the first reflective surface 21 has a parabolic surface shape in the X direction, the reflected laser beam 50c can be focused onto the focal point F1 while suppressing spherical aberrations in the X direction. Because the second reflective surface 22 has a parabolic surface shape in the X direction, the reflected laser beam 50c can be substantially collimated while suppressing spherical aberrations in the X direction.

On the other hand, because the first reflective surface 21 and the second reflective surface 22 have substantially no curvature in the Y direction, the laser beam 50c from the array light-emitting portion 1 is reflected by the first reflective surface 21 and the second reflective surface 22, and is emitted toward the stepped mirror 3 while maintaining a substantially collimated state.

Although the laser beam 50c has been described in an example here, the same applies to the other laser beam 50a, the laser beam 50b, and the laser beam 50d.

In the present embodiment, a configuration in which the array light-emitting portion 1 emits collimated light, and the light reflected by the second reflective surface 22 becomes collimated light has been exemplified, but they need not necessarily be collimated light, but may be focused light or divergent light.

Configuration and Function Example of Stepped Mirror 3

Figure 11:
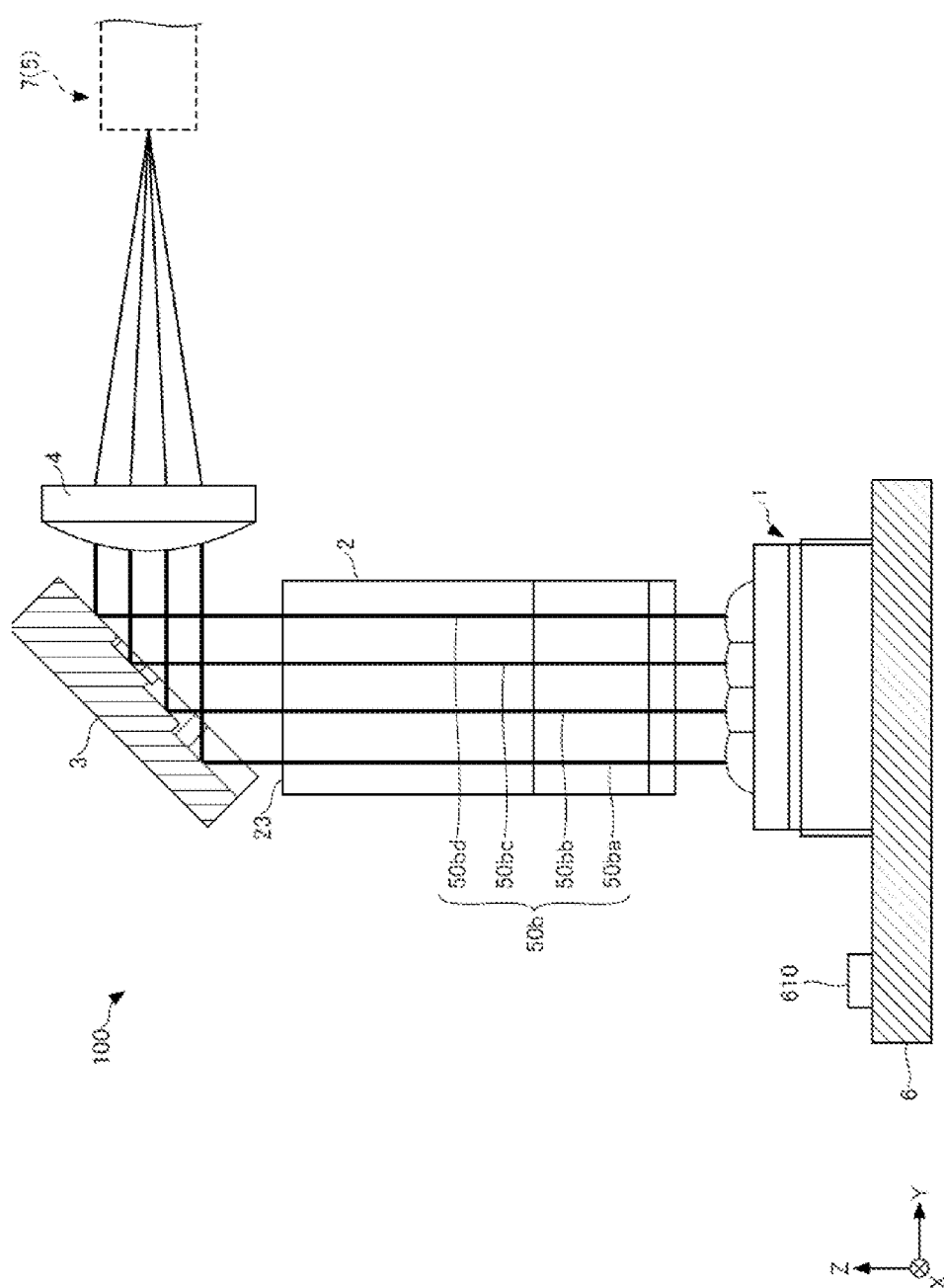
FIG. 11 is a cross-sectional view taken along line XI-XI in FIG. 7.
Figure 12:
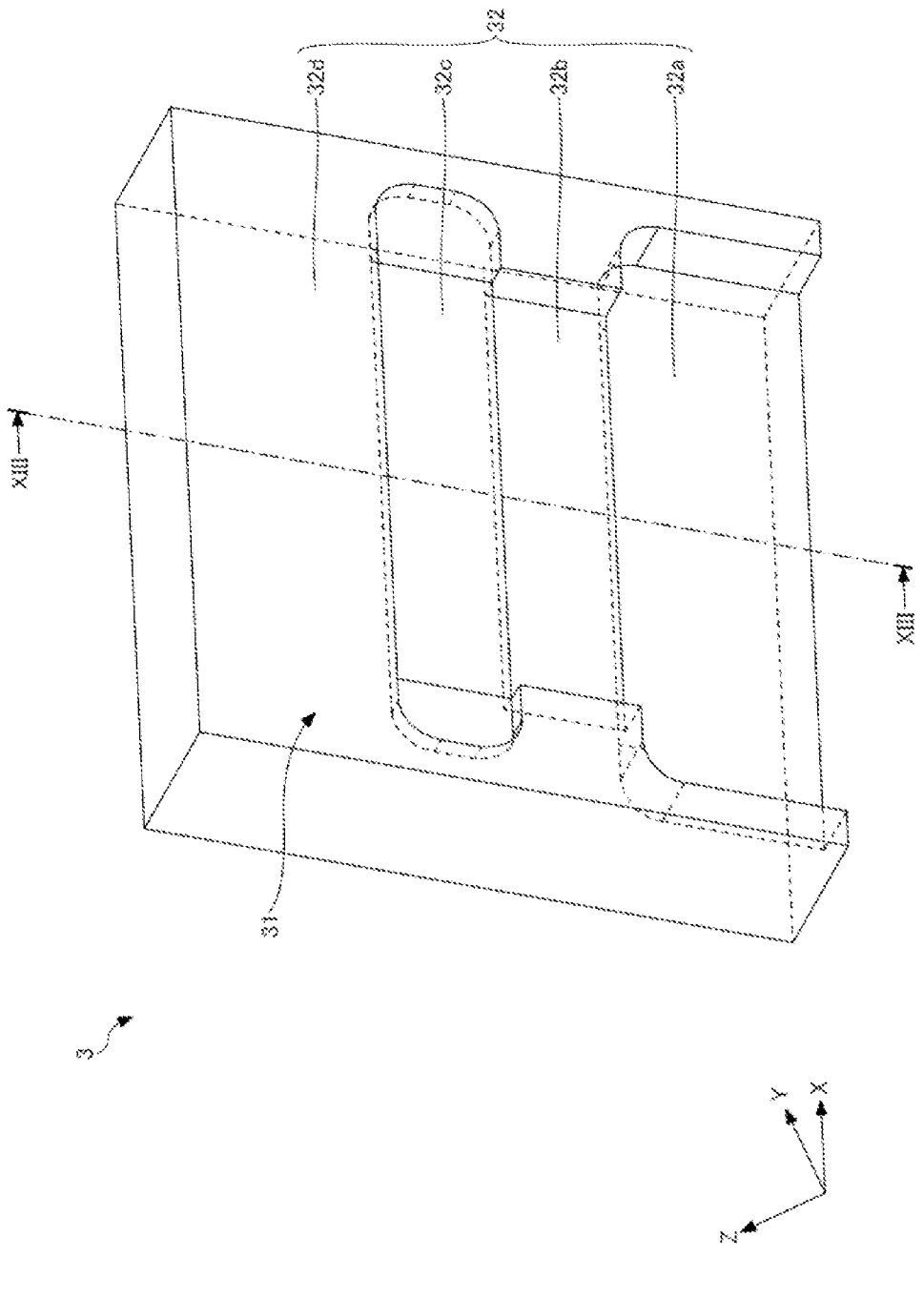
FIG. 12 is a perspective view of a stepped mirror included in the light source device according to the embodiment.
Figure 13:
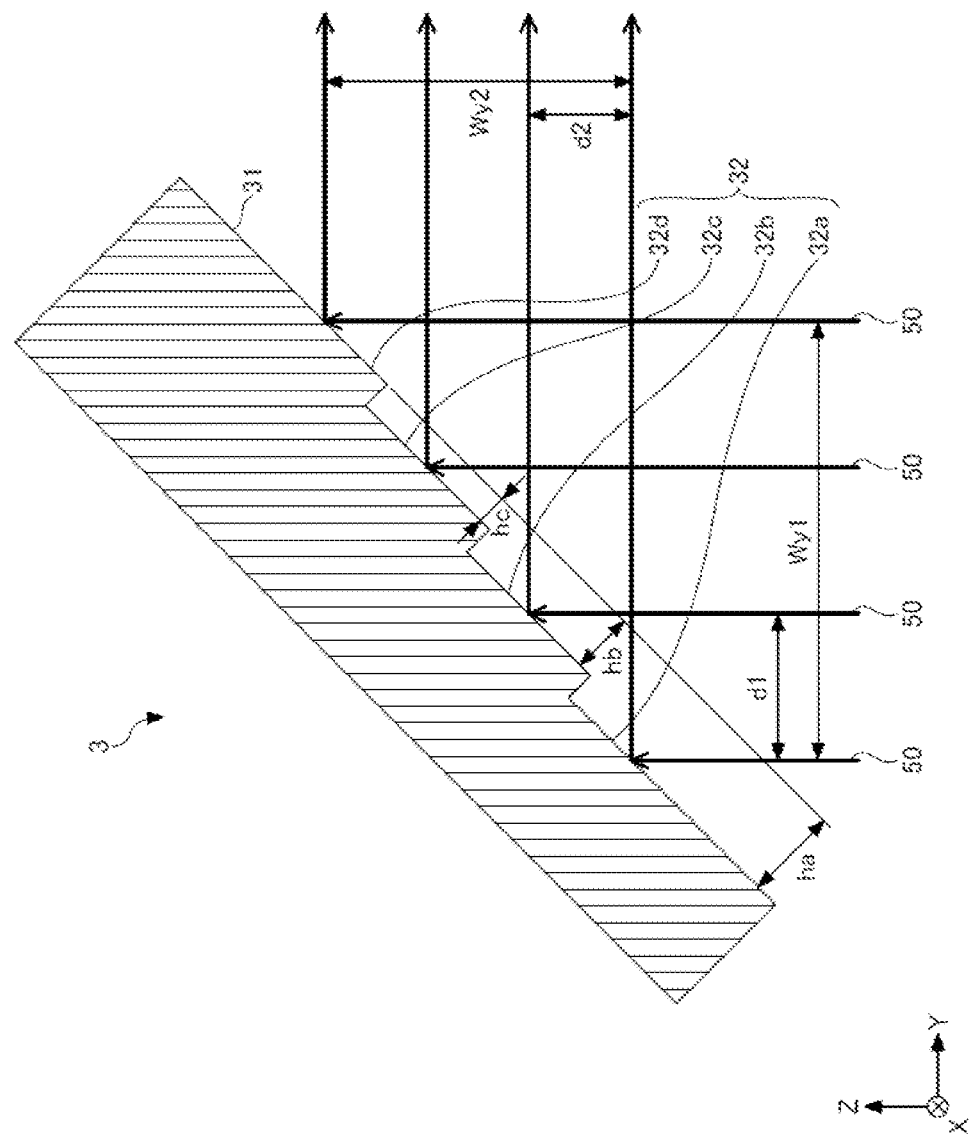
FIG. 13 is a cross-sectional view taken along line XIII-XIII in FIG. 12.
Figure 14:
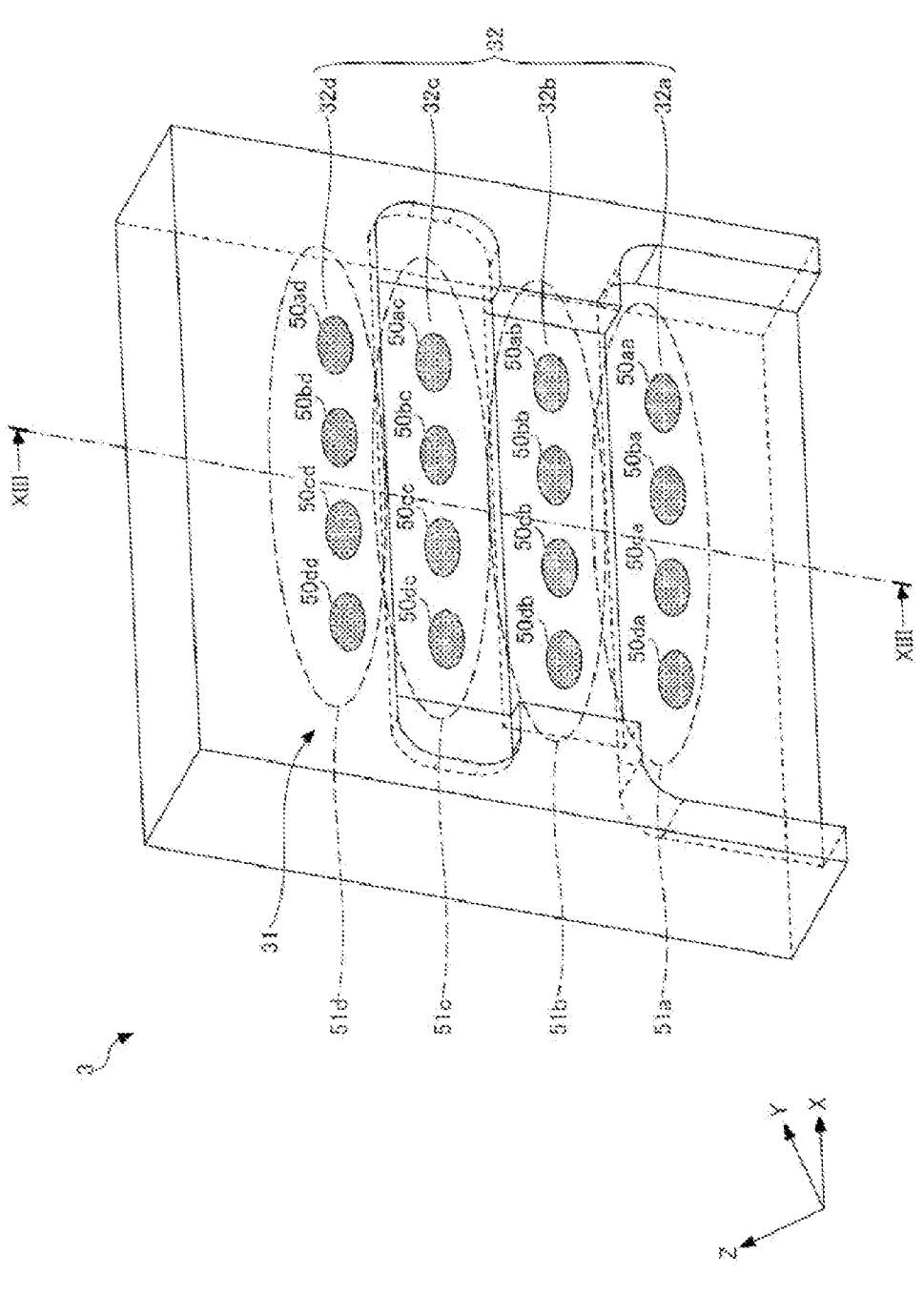
FIG. 14 is a view illustrating reflection of a laser beam by a stepped reflective surface of the stepped mirror.

FIGS. 11 to 14 are diagrams illustrating the configuration and function of the stepped mirror 3. FIG. 11 is a cross-sectional view taken along line XI-XI in FIG. 7 as viewed from the −X direction side. FIG. 12 is a perspective view of the stepped mirror 3 as viewed from the +Y direction side. FIG. 13 is a cross-sectional view taken along line XIII-XIII in FIG. 12 as viewed from the −X direction side. FIG. 14 is a diagram illustrating reflection of a laser beam by a stepped reflective surface of the stepped mirror 3. FIG. 14 illustrates a state in which the stepped mirror 3 inclined by 45 degrees around the X-axis with respect to a plane including the X-axis and the Z-axis is viewed from the +Y direction side.

In FIG. 11, the laser beam 50a, the laser beam 50b, the laser beam 50c, and the laser beam 50d emitted by each of the plurality of array light-emitting portions 1 are represented by thick solid lines. In FIG. 11, a laser beam emitted from one array light-emitting portion 1 is represented by one thick solid line.

As illustrated in FIG. 11, the stepped mirror 3 is disposed on the +Z direction side of the parabolic mirror 2 so as to be inclined by approximately 45 degrees around the X-axis with respect to the plane including each of the X-axis and the Z-axis. However, this angle is not limited to approximately 45 degrees, and can be appropriately selected depending on the position where the optical fiber 5 is disposed.

The stepped mirror 3 reflects each of a laser beam 50ba, a laser beam 50bb, a laser beam 50bc, and a laser beam 50bd emitted from the emission surface 23 of the parabolic mirror 2 to the +Z direction side toward the condenser lens 4. The laser beam 50ba, the laser beam 50bb, the laser beam 50bc, and the laser beam 50bd reflected by the stepped mirror 3 are incident on the condenser lens 4, and are condensed by the condenser lens 4 to enter the core of the optical fiber 5 held in the optical connector 7.

As illustrated in FIGS. 12 and 13, the stepped mirror 3 is a mirror in which a stepped reflective surface 32 having a plurality of stepped surfaces having different heights is formed. The stepped reflective surface 32 reflects the laser beam 50 reflected by the second reflective surface 22 toward the condenser lens 4.

In the present embodiment, the stepped reflective surface 32 is formed by forming a plurality of concave portions having different heights (depths) with respect to a flat surface portion 31 in the flat surface portion 31 of the plate-like member, and providing a reflective surface made of a metal material such as aluminum or a dielectric multi-layer film, etc. on the flat surface portion 31 and a bottom surface of the concave portion. The main material of the stepped mirror 3 includes, for example, glass such as quartz or BK7 or resin. Because the stepped mirror 3 reflects the laser beam, from the viewpoint of suppressing damage due to light energy, it is preferable that the stepped mirror 3 is configured to include a glass material, and it is preferable that the reflective surface is formed of a heat-resistant material.

In the present embodiment, the stepped reflective surface 32 includes a first stepped surface 32a, a second stepped surface 32b, a third stepped surface 32c, and a fourth stepped surface 32d, so as to be arranged along a side farther from the side closer to the parabolic mirror 2. The first stepped surface 32a, the second stepped surface 32b, the third stepped surface 32c, and the fourth stepped surface 32d correspond to the plurality of stepped surfaces having different heights. Regarding the height with respect to the flat surface portion 31, the first stepped surface 32a has a height ha, the second stepped surface 32b has a height hb, the third stepped surface 32c has a height hc, and the fourth stepped surface 32d has no difference in height with respect to the flat surface portion 31.

In FIG. 11, the laser beam 50ba, laser beam 50bb, laser beam 50bc, and laser beam 50bd are four laser beams arranged along the Y direction. The laser beam 50ba is a laser beam emitted from the collimating lens 131a of the array light-emitting portion 1b. The laser beam 50bb is a laser beam emitted from the collimating lens 131b of the array light-emitting portion 1*b*. The laser beam 50*bc* is a laser beam emitted from the collimating lens 131*c* of the array light-emitting portion 1*b*. The laser beam 50*bd* is a laser beam emitted from the collimating lens 131*d* of the array light-emitting portion 1*b*.

When the laser beam 50*ba*, the laser beam 50*bb*, the laser beam 50*bc*, and the laser beam 50*bd* are not distinguished, they are collectively referred to as a laser beam 50*b*. In FIG. 11, the laser beam 50*b* emitted by the array light-emitting portion 1*b* is illustrated, but the behavior of the laser beam reflected by the stepped mirror 3 and condensed by the condenser lens 4 is the same also in the other laser beams 50*a*, 50*c*, and 50*d*. As illustrated in FIG. 14, the stepped reflective surface 32 of the stepped mirror 3 includes the first stepped surface 32*a*, the second stepped surface 32*b*, the third stepped surface 32*c*, and the fourth stepped surface 32*d*, and reflects sixteen laser beams 50.

The first stepped surface 32*a*, the second stepped surface 32*b*, the third stepped surface 32*c*, and the fourth stepped surface 32*d* respectively corresponds to and reflects a first light beam array 51*a*, a second light beam array 51*b*, a third light beam array 51*c*, and a fourth light beam array 51*d*, in a one-to-one manner. Specifically, the first stepped surface 32*a* reflects the first light beam array 51*a* in the +Y direction. The second stepped surface 32*b* reflects the second light beam array 51*b* in the +Y direction. The third stepped surface 32*c* reflects the third light beam array 51*c* in the +Y direction. The fourth stepped surface 32*d* reflects the fourth light beam array 51*d* in the +Y direction. The first light beam array 51*a*, the second light beam array 51*b*, the third light beam array 51*c*, and the fourth light beam array 51*d* respectively correspond to a plurality of light beam arrays arranged along the Y direction.

In FIG. 14, the first light beam array 51*a*, the second light beam array 51*b*, the third light beam array 51*c*, and the fourth light beam array 51*d* appear to be arranged only along the Z direction, but the first stepped surface 32*a*, the second stepped surface 32*b*, the third stepped surface 32*c*, and the fourth stepped surface 32*d* are different from each other in position along the Y direction. Thus, the first light beam array 51*a*, the second light beam array 51*b*, the third light beam array 51*c*, and the fourth light beam array 51*d* are also arranged along the Y direction.

Each of the first light beam array 51*a*, the second light beam array 51*b*, the third light beam array 51*c*, and the fourth light beam array 51*d* includes a plurality of laser beams 50 reflected by the second reflective surface 22 and arranged along the X direction. To be specific, the first light beam array 51*a* includes a laser beam 50*aa*, a laser beam 50*ba*, a laser beam 50*ca*, and a laser beam 50*da* which are arranged along the X direction. The second light beam array 51*b* includes a laser beam 50*ab*, a laser beam 50*bb*, a laser beam 50*cb*, and a laser beam 50*db* which are arranged along the X direction. The third light beam array 51*c* includes a laser beam 50*ac*, a laser beam 50*bc*, a laser beam 50*cc*, and a laser beam 50*dc* which are arranged along the X direction. The fourth light beam array 51*d* includes a laser beam 50*ad*, a laser beam 50*bd*, a laser beam 50*cd*, and a laser beam 50*dd* which are arranged along the X direction.

As illustrated in FIG. 13, the first stepped surface 32*a*, the second stepped surface 32*b*, the third stepped surface 32*c*, and the fourth stepped surface 32*d* are different from each other in the height of the reflective surface with respect to the flat surface portion 31. According to the difference in height with respect to the flat surface portion 31, the position along the Z direction of the laser beam 50 incident on each of the stepped surfaces from the parabolic mirror 2 is shifted.

For example, in a case in which the laser beam 50 is reflected by the first stepped surface 32*a*, the incident position is shifted in the +Z direction according to the height ha compared to a case in which the laser beam 50 is reflected at the height of the flat surface portion 31. Similarly, in a case in which the laser beam 50 is reflected by the second stepped surface 32*b*, the incident position is shifted in the +Z direction according to the height hb compared to a case in which the laser beam 50 is reflected at the height of the flat surface portion 31. In a case in which the laser beam 50 is reflected by the third stepped surface 32*c*, the incident position is shifted in the +Z direction according to the height hc compared to a case in which the laser beam 50 is reflected at the height of the flat surface portion 31.

As a result, regarding the interval between the plurality of laser beams 50, an interval d2 along the Z direction at the position where the laser beam 50 is reflected by the stepped reflective surface 32 is smaller than an interval d1 along the Y direction at the position where the laser beam 50 is incident on the stepped reflective surface 32. Furthermore, an entire width Wy2 along the Z direction of the plurality of laser beams 50 at a position where the laser beam 50 is reflected by the stepped reflective surface 32 is smaller than an entire width Wy1 along the Y direction of the plurality of laser beams 50 at a position where the laser beam 50 is incident on the stepped reflective surface 32. Note that the ratio of the interval d1 to the interval d2, and the ratio of the entire width Wy1 and the entire width Wy2 can be changed as appropriate depending on the number of light-emitting portions, the core diameter of the optical fiber 5, etc.

Configuration Example of Optical Fiber 5

Figure 15:
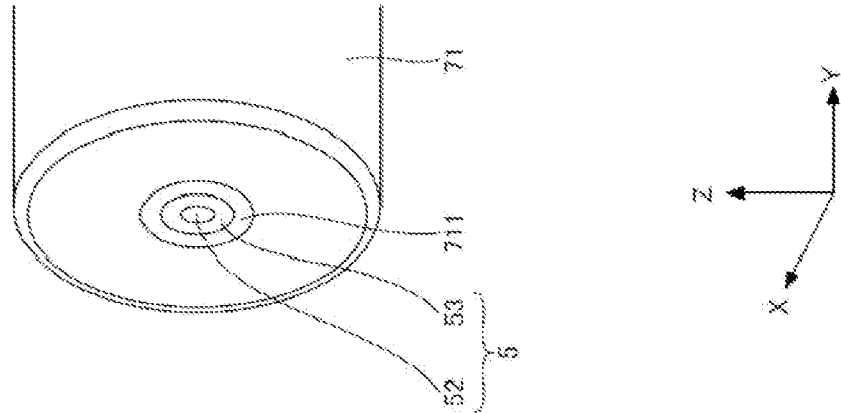
FIG. 15 is a perspective view of an end portion of a ferrule for explaining an optical fiber.

FIG. 15 is a perspective view of an end portion of the ferrule 71 for explaining the optical fiber 5. As illustrated in FIG. 15, the optical fiber 5 includes a core 52 and a cladding 53 that covers the periphery of the core 52. The ferrule 71 is configured to cover the optical fiber 5 via a covering 711 that covers the periphery of the cladding 53, and fix the optical fiber 5 therein.

The laser beam 50 condensed by the condenser lens 4 is incident on the core 52 of the optical fiber 5. Note that the light source device 100 may have a configuration that does not include the optical fiber 5 connected to the light source device 100.

Effects of Light Source Device 100

Subsequently, the effects of the light source device 100 will be described.

In the present embodiment, the light source device 100 includes the plurality of light-emitting portions 113 arranged in at least the X direction (the arrangement direction). Further, the light source device 100 has the parabolic mirror 2 and the stepped mirror 3 (the plurality of optical members), which have the first reflective surface 21 and the second reflective surface 22, and reflect the laser beams 50 (light) from the plurality of light-emitting portions 113 in the +Y direction (predetermined direction). Furthermore, the light source device 100 includes the condenser lens 4 that condenses the laser beam 50 emitted from the parabolic mirror 2 and the stepped mirror 3.

The first reflective surface 21 reflects the laser beam 50 emitted by the plurality of light-emitting portions 113 toward the second reflective surface 22, and the second reflective surface 22 reflects the laser beam 50 reflected by the first reflective surface 21. Each of the first reflective surface 21 and the second reflective surface 22 is a surface having a curvature in the X direction, and the curvature (1/R2) in the X direction of the second reflective surface 22 is greater than the curvature (1/R1) in the X direction of the first reflective surface 21.

The light source device 100 condenses, by the condenser lens 4, the light emitted by the plurality of light-emitting portions 113, and thus a large amount of light can be condensed.

In the light source device 100, the entire width Wx1 of the plurality of laser beams 50 along the X direction can be increased according to the number of the plurality of light-emitting portions 113 arranged along the X-axis direction at a position where the plurality of laser beams 50 are incident on the first reflective surface 21, and thus a large amount of light can be condensed.

In the light source device 100, the entire width Wx2 of the plurality of laser beams 50 along the X direction can be smaller than the entire width Wx1 of the plurality of laser beams 50 at a position where the plurality of laser beams 50 are reflected by the second reflective surface 22. This allows the laser beam 50 having the entire width Wx2 to be condensed into a narrow range using the condenser lens 4 having a narrow opening diameter and a small aberration.

As described above, in the present embodiment, the light source device 100 having good light condensing properties can be provided. The laser beam 50 can be efficiently incident on the core 52 of the optical fiber 5, and the brightness of the light emitted from the optical fiber can be increased, and thus the light source device 100 can be used for high luminance lighting, etc.

The light source device 100 can use the condenser lens 4 having a narrow opening diameter, and may not use a condenser lens having a combination of lenses or a condenser lens having a complex shape, and thus the cost of the light source device 100 can be reduced.

In the present embodiment, the focal point F1 in at least a portion of the first reflective surface 21 overlaps with the focal point F2 in at least a portion of the second reflective surface 22. According to this configuration, the collimated light incident on the first reflective surface 21 is reflected by each of the first reflective surface 21 and the second reflective surface 22, and then converted to collimated light, and can be incident on the condenser lens 4. Because the collimated light is easy to pass through the target optical path, light loss such as flare light or ghost light can be suppressed compared to the focused light or the divergent light. As a result, the light source device 100 having good light condensing properties can be provided.

In the present embodiment, the plurality of light-emitting portions 113 are arranged along each direction in the X direction and the Y direction. The stepped mirror 3 includes the stepped reflective surface 32 that includes the first stepped surface 32a, the second stepped surface 32b, the third stepped surface 32c, and the fourth stepped surface 32d having different heights, and that reflects the laser beam 50 reflected by the second reflective surface 22 toward the condenser lens 4.

The first stepped surface 32a, the second stepped surface 32b, the third stepped surface 32c, and the fourth stepped surface 32d respectively corresponds to and reflects the first light beam array 51a, the second light beam array 51b, the third light beam array 51c, and the fourth light beam array 51d arranged along the Y direction, in a one-to-one manner. Each of the first light beam array 51a, the second light beam array 51b, the third light beam array 51c, and the fourth light beam array 51d includes a plurality of laser beams 50 reflected by the second reflective surface 22 and arranged along the X direction. According to this configuration, the light source device 100 can shift the position where the laser beam 50 is incident on each of the first stepped surface 32a, the second stepped surface 32b, the third stepped surface 32c, and the fourth stepped surface 32d in the Z direction. In this manner, in the light source device 100, the entire width Wy1 of the plurality of laser beams 50 along the Y direction can be increased according to the number of the plurality of light-emitting portions 113 arranged along the Y-axis direction at a position where the laser beam 50 is incident on the stepped reflective surface 32, and thus a large amount of light can be condensed. As described above, in the present embodiment, the light source device 100 having good light condensing properties can be provided.

In the present embodiment, each of the plurality of light-emitting portions 113 emits the laser beam 50, and regarding the beam width (width) along the X direction of the laser beam 50, the beam width D2 at a position where the laser beam 50 is reflected by the second reflective surface 22 is smaller than the beam width D1 at a position where the laser beam 50 is incident on the first reflective surface 21. Additionally, regarding the interval between the plurality of laser beams 50, the interval d2 along the Z direction at the position where the laser beam 50 is reflected by the stepped reflective surface 32 is smaller than the interval d1 along the Y direction at the position where the laser beam 50 is incident on the stepped reflective surface 32. According to this configuration, in the light source device 100, the entire width Wx2 at a position where the laser beam 50 is reflected by the second reflective surface 22 can be smaller than the entire width Wx1 at a position where the laser beam 50 is incident on the first reflective surface 21. Further, in the light source device 100, the entire width Wy2 at a position where the laser beam 50 is reflected by the stepped reflective surface 32 can be smaller than the entire width Wy1 at a position where the laser beam 50 is incident on the stepped reflective surface 32.

In the present embodiment, the light source device 100 includes the parabolic mirror 2 (first optical member) integrally including the first reflective surface 21 and the second reflective surface 22, and the stepped mirror 3 (second optical member) having the stepped reflective surface 32. According to this configuration, the first optical member and the second optical member can be easily manufactured in comparison to a case of using an optical member integrally composed of the first reflective surface 21, the second reflective surface 22, and the stepped reflective surface 32. In addition, the light source device 100 can be easily assembled in comparison to a case of using an optical member in which the first reflective surface 21, the second reflective surface 22, and the stepped reflective surface 32 are each separately configured.

The light source device 100 may further include the optical fiber 5 including the core 52 and the cladding 53 that covers the periphery of the core 52, and may be configured such that the laser beam 50 condensed by the condenser lens 4 is incident on the core 52 of the optical fiber 5. Accordingly, light from the plurality of light-emitting portions 113 can be guided by one optical fiber 5. This can provide a light source device that increases the incidence efficiency of the optical fiber 5 on the core 52 while suppressing an increase in costs corresponding to the number of optical fibers.

Modification Examples

In the first embodiment, an optical member including the parabolic mirror 2 and the stepped mirror 3 is exemplified, but the configuration of the optical member is not limited thereto, and various variations are possible. Hereinafter, a light source device according to a modification example having various optical members will be described. Further, members having the same terms and reference characters as the first embodiment represent the same or similar members, and a detailed description of these members will be omitted as appropriate. This also applies to other embodiments and modification examples described below.

Figure 16:
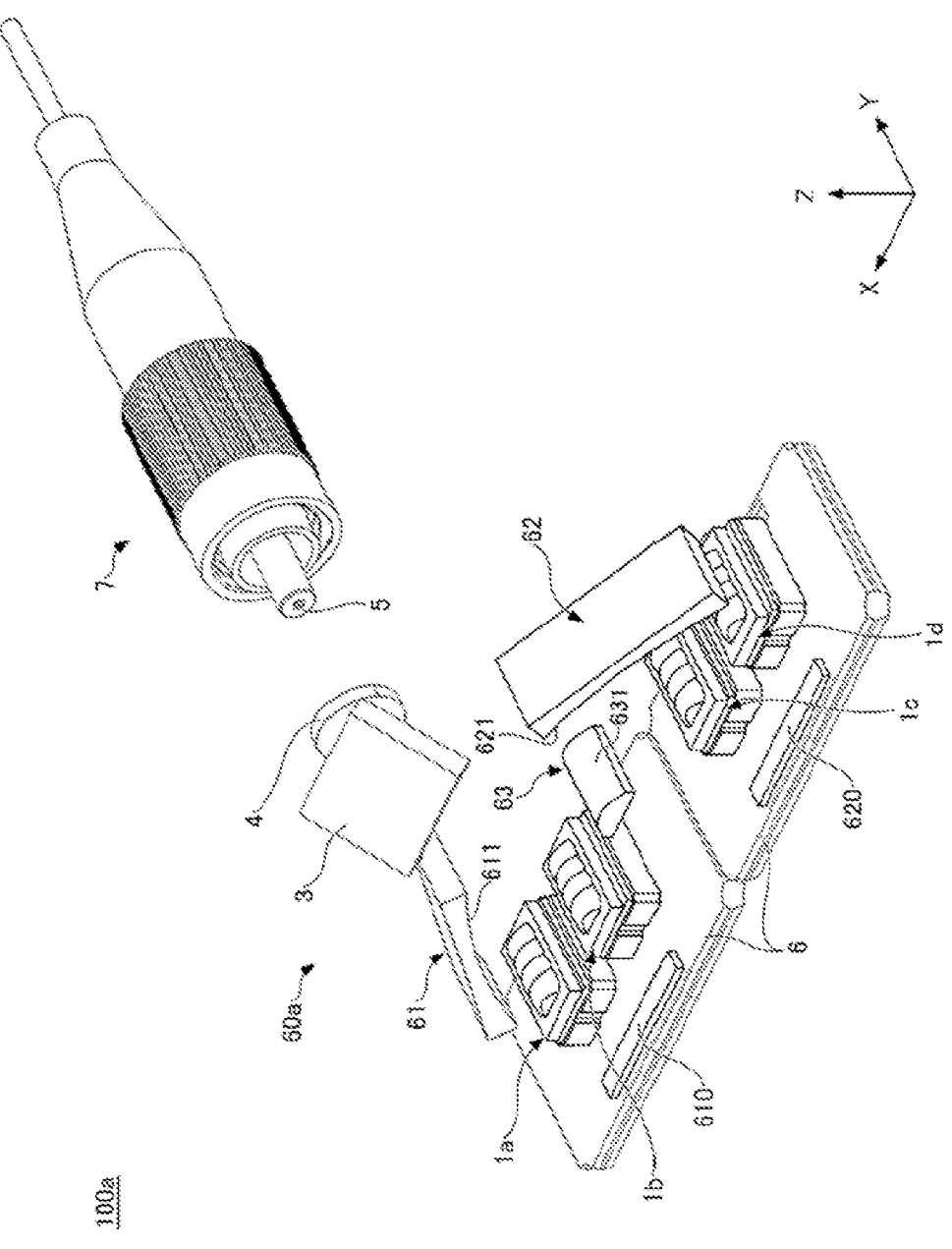
FIG. 16 is a diagram of a configuration example of an optical member group according to a first modification example of the first embodiment.

FIG. 16 is a diagram illustrating an example of a configuration of an optical member group 60a included in a light source device 100a according to a first modification example of the first embodiment. As illustrated in FIG. 16, the optical member group 60a includes a first parabolic surface member 61, a second parabolic surface member 62, and a third parabolic surface member 63.

The first parabolic surface member 61 has a third reflective surface 611 that is part of a cylindrical concave surface having a curvature in the X direction. The second parabolic surface member 62 has a fourth reflective surface 621 that is part of a cylindrical concave surface having a curvature in the X direction. The third reflective surface 611 and the fourth reflective surface 621 include a parabolic surface shape having the same curvature in the X direction. The third reflective surface 611 and the fourth reflective surface 621 are examples of the first reflective surface. The third reflective surface 611 and the fourth reflective surface 621 have the same or similar functions as the first reflective surface 21 in the first embodiment.

The third parabolic surface member 63 has a fifth reflective surface 631 that is part of a cylindrical convex surface having a curvature in the X direction. The fifth reflective surface 631 has a parabolic surface shape in the X direction. The fifth reflective surface 631 is an example of the second reflective surface. The fifth reflective surface 631 has the same or similar functions as the second reflective surface 22 in the first embodiment.

The light source device 100a includes the optical member group 60a including the first parabolic surface member 61 having the third reflective surface 611, the second parabolic surface member 62 having the fourth reflective surface 621, and the third parabolic surface member 63 having the fifth reflective surface 631, and the member having reflective surfaces corresponding to the first reflective surface and the second reflective surface in the first embodiment is not integrally formed with one member. Thus, the optical member having the first reflective surface and the second reflective surface can be easily produced in comparison to the light source device 100 according to the first embodiment. Other effects are the same as in the first embodiment.

Figure 17:
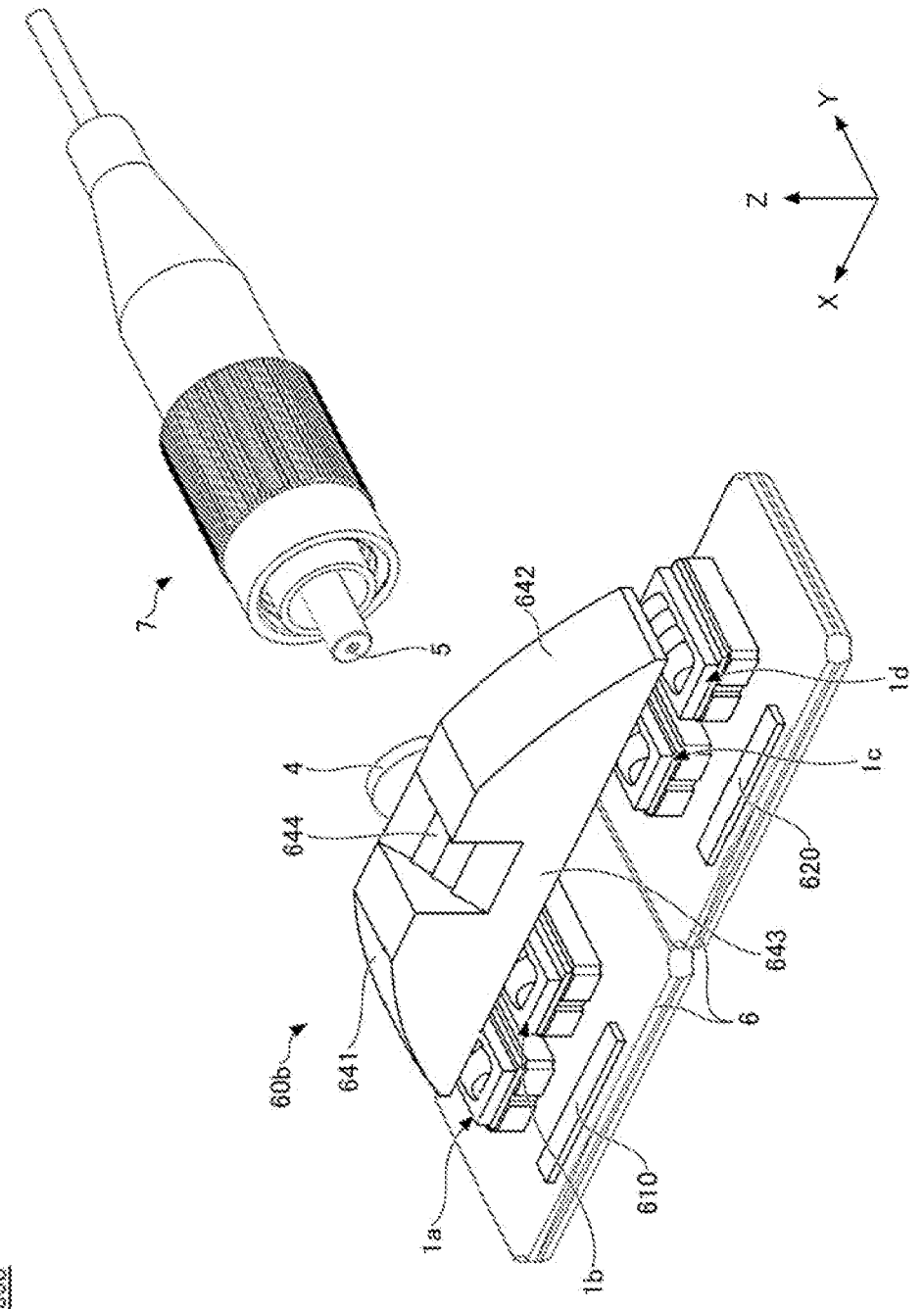
FIG. 17 is a diagram of a configuration example of an optical member according to a second modification example of the first embodiment.

FIG. 17 is a diagram illustrating an example of a configuration of an optical member 60b included in a light source device 100b according to a second modification example of the first embodiment. As illustrated in FIG. 17, the optical member 60b includes a sixth reflective surface 641, a seventh reflective surface 642, an eighth reflective surface 643, and a first stepped reflective surface 644.

The sixth reflective surface 641 is part of a cylindrical surface having a curvature in the X direction. The seventh reflective surface 642 is part of a cylindrical surface having a curvature in the X direction. The sixth reflective surface 641 and the seventh reflective surface 642 include a parabolic surface shape having the same curvature in the X direction. The sixth reflective surface 641 and the seventh reflective surface 642 are examples of the first reflective surface. The sixth reflective surface 641 and the seventh reflective surface 642 have the same or similar functions as the first reflective surface 21 in the first embodiment.

The eighth reflective surface 643 is part of a cylindrical surface having a curvature in the X direction. The eighth reflective surface 643 has a parabolic surface shape in the X direction. The eighth reflective surface 643 is an example of the second reflective surface. The eighth reflective surface 643 has the same or similar functions as the second reflective surface 22 in the first embodiment.

The first stepped reflective surface 644 is an example of a stepped reflective surface that has a plurality of stepped surfaces having different heights and reflects the laser beam reflected by the eighth reflective surface 643 toward the condenser lens 4. The first stepped reflective surface 644 has the same or similar functions as the stepped reflective surface 32 in the first embodiment.

The light source device 100b includes the optical member 60b in which reflective surfaces corresponding to the first reflective surface and the second reflective surface and the stepped reflective surface in the first embodiment is integrally formed with one member. Thus, the light source device 100b can be easily assembled in comparison to the light source device 100 according to the first embodiment. Other effects are the same as the effects in the first embodiment.

Second Embodiment

Figure 18:
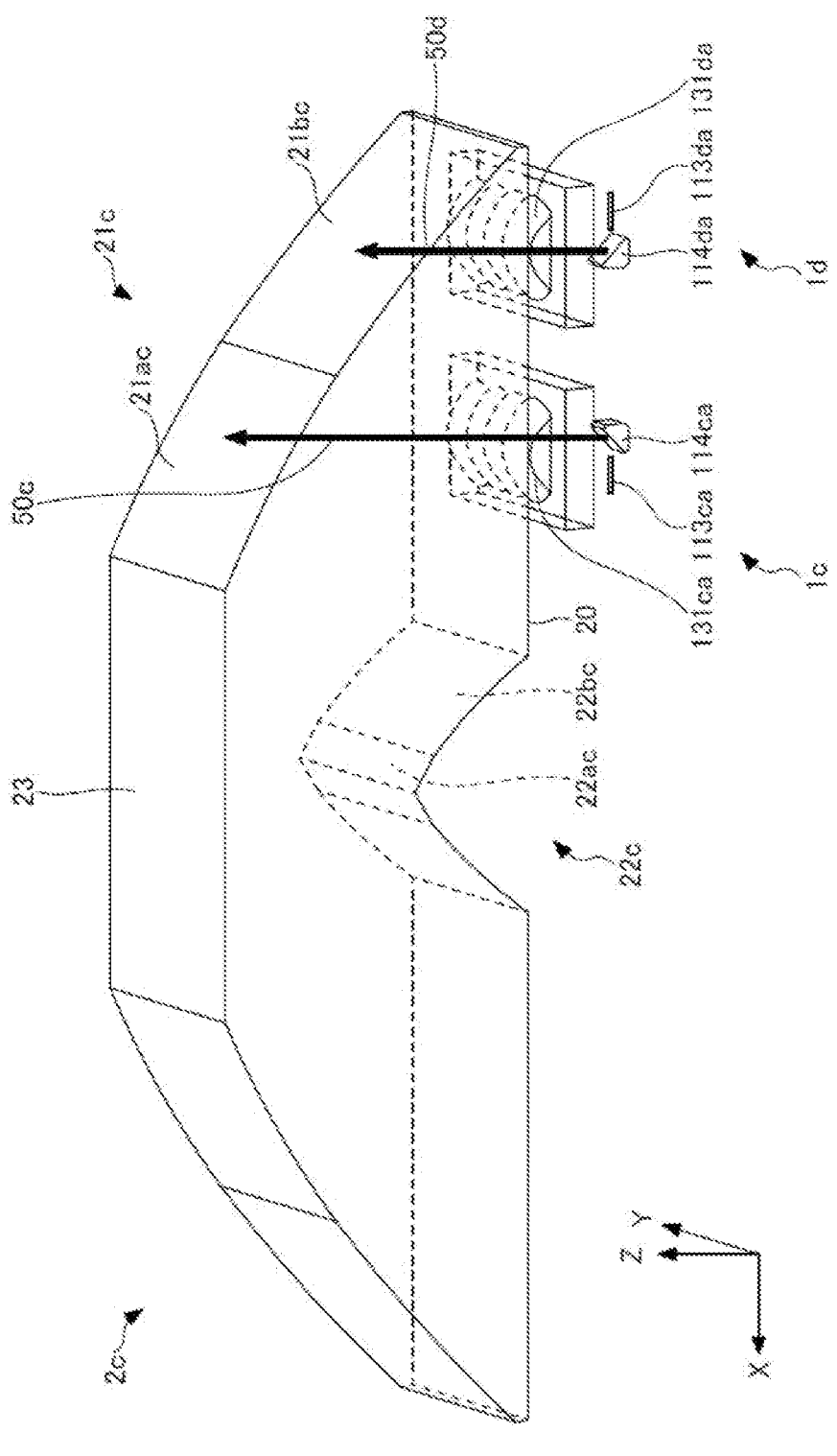
FIG. 18 is a perspective view of a parabolic mirror included in a light source device according to a second embodiment.

Subsequently, a light source device 100c according to a second embodiment will be described. FIG. 18 is a perspective view illustrating an example of a configuration of a parabolic mirror 2c included in the light source device 100c. FIG. 18 illustrates the parabolic mirror 2c, the array light-emitting portion 1c, and the array light-emitting portion 1d of the light source device 100c.

FIG. 18 illustrates a light-emitting portion 113ca, a light reflecting member 114ca, and a collimating lens 131ca of the array light-emitting portion 1c, and a light-emitting portion 113da, a light reflecting member 114da, and a collimating lens 131da of the array light-emitting portion 1d. The light-emitting portion 113ca is an example of the first light-emitting portion, and the light-emitting portion 113da is an example of the second light-emitting portion.

The parabolic mirror 2c includes a first reflective surface 21c and a second reflective surface 22c. The first reflective surface 21c includes a first region 21ac and a second region 21bc. The second reflective surface 22c includes a third region 22ac and a fourth region 22bc.

The first region 21ac reflects the laser beam 50c emitted by the light-emitting portion 113ca. The second region 21bc reflects the laser beam 50d emitted by the light-emitting portion 113da. Each of the first region 21ac and the second region 21bc is a rectangular region in a plan view, and has a surface having a curvature in the X direction and having a surface that is substantially free of a curvature in the Y direction. Each of the first region 21ac and the second region 21bc has a parabolic surface shape in the X direction, but the parabolic surface shape of the first region 21ac is different from the parabolic surface shape of the second region 21bc.

The third region 22ac reflects the laser beam 50c emitted by the light-emitting portion 113ca and reflected by the first reflective surface 21c. The fourth region 22bc reflects the laser beam 50d emitted by the light-emitting portion 113da and reflected by the first reflective surface 21c. Each of the third region 22ac and the fourth region 22bc is a rectangular region in a plan view, and has a surface having a curvature in the X direction and having a surface that is substantially free of a curvature in the Y direction. Each of the third region 22ac and the fourth region 22bc has a parabolic surface shape in the X direction, but the parabolic surface shape of the third region 22ac is different from the parabolic surface shape of the fourth region 22bc.

The laser beam 50c emitted on the −X direction side by the light-emitting portion 113ca is reflected toward the +Z direction side by the light reflecting member 114ca, and is substantially collimated by the collimating lens 131ca, and then enter the inside of the parabolic mirror 2c through the incident surface 20. The laser beam 50c enters the inside of the parabolic mirror 2c is reflected toward the third region 22ac by the first region 21ac, and then is reflected by the third region 22ac toward the emission surface 23, and then emitted through the emission surface 23.

The laser beam 50d emitted on the +X direction side by the light-emitting portion 113da is reflected toward the +Z direction side by the light reflecting member 114da, and is substantially collimated by the collimating lens 131da, and then enter the inside of the parabolic mirror 2c through the incident surface 20. The laser beam 50d enter the inside of the parabolic mirror 2c is reflected toward the fourth region 22bc by the second region 21bc, and then is reflected by the fourth region 22bc toward the emission surface 23, and then emitted through the emission surface 23.

Figure 19:
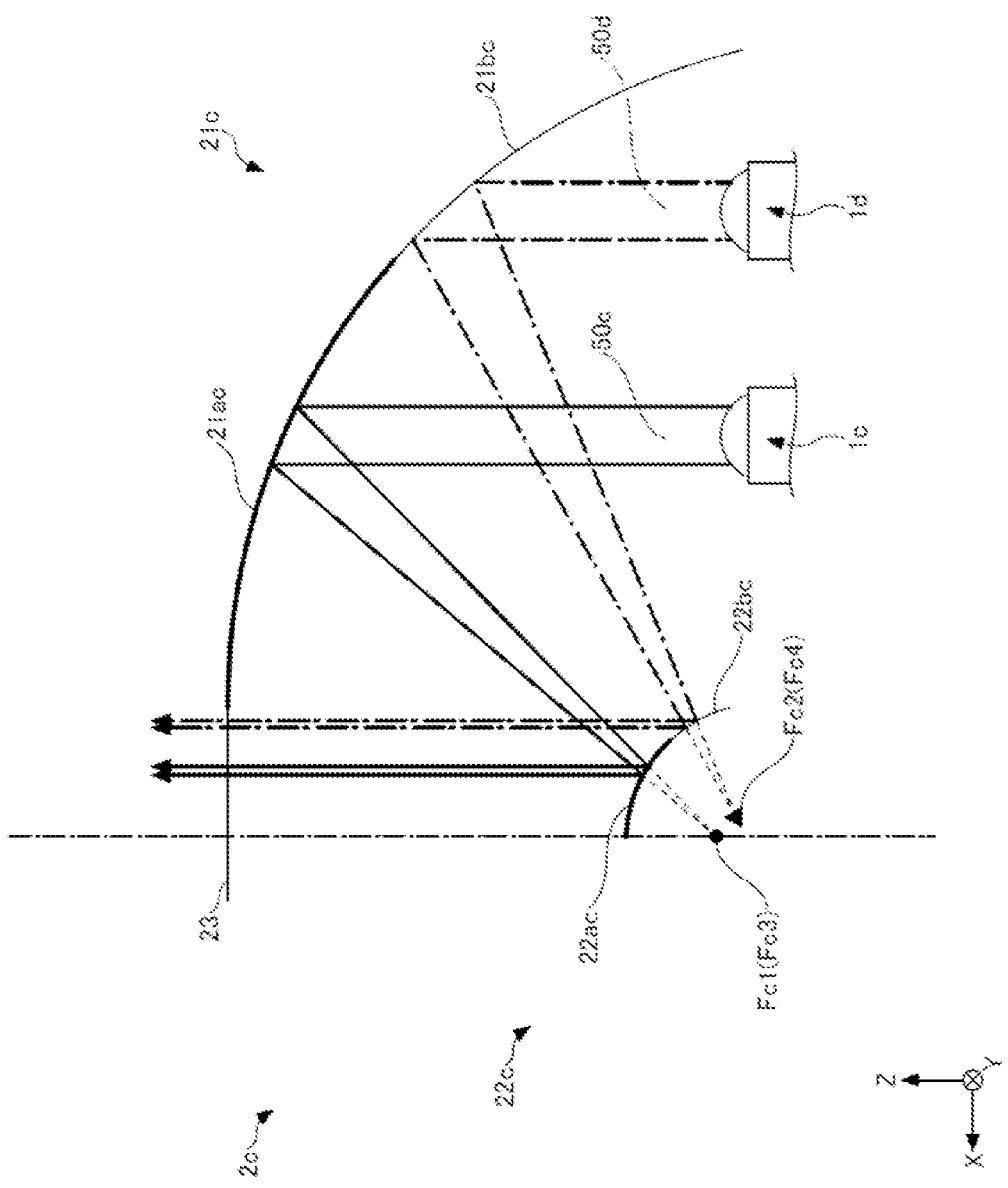
FIG. 19 is a view illustrating a first example of reflection by a parabolic mirror according to the second embodiment.

FIG. 19 is a diagram illustrating a first example of reflection by the parabolic mirror according to the second embodiment, and is a cross-sectional view of a portion of each of the first reflective surface 21c and the second reflective surface 22c in the parabolic mirror 2c as viewed from the −Y direction side.

A focal point Fc1 of the first region 21ac overlaps with a focal point Fc3 of the third region 22ac. In other words, the focal point Fc1 is located at substantially the same position as the focal point Fc3. Thus, the laser beam 50c reflected by the first region 21ac toward the third region 22ac is substantially collimated by reflection by the third region 22ac, and then emitted through the emission surface 23.

A focal point Fc2 of the second region 21bc overlaps with a focal point Fc4 of the fourth region 22bc. In other words, the focal point Fc2 is located at substantially the same position as the focal point Fc4. Therefore, the laser beam 50d reflected by the second region 21bc toward the fourth region 22bc is substantially collimated by reflection by the fourth region 22bc, and then emitted through the emission surface 23. Because the surface shape of the first region 21ac is different from that of the second region 21bc, the focal point Fc1 of the first region 21ac and the focal point Fc2 of the second region 21bc do not overlap with each other.

In the present embodiment, the first reflective surface 21c is divided into two regions of the first region 21ac and the second region 21bc, and the focal points of those are different in each region. Similarly, the second reflective surface 22c is divided into two regions of the third region 22ac and the fourth region 22bc, and the focal points of those are different in each region. According to this configuration, the laser beam reflected by the second reflective surface 22 can be condensed. As a result, the light source device 100c having good light condensing properties can be provided.

The laser beam 50c from the array light-emitting portion 1c is reflected by the first region 21ac, and then reflected by the third region 22ac to be substantially collimated. The laser beam 50d from the array light-emitting portion 1d is reflected by the second region 21bc, and then reflected by the fourth region 22bc to be substantially collimated. As a result, it makes it possible to improve the light condensing properties of the laser beam 50 that is condensed by the condenser lens 4 after being reflected by the parabolic mirror 2c, and to provide the light source device 100 having good light condensing properties with respect to the laser beam 50 from the plurality of light-emitting portions 113. Note that the advantageous effects other than those described above are similar to those in the first embodiment.

FIG. 20 is a diagram illustrating a second example of reflection by the parabolic mirror according to the second embodiment, and is a cross-sectional view of each of the first reflective surface 21c and the second reflective surface 22d in the parabolic mirror 2d as viewed from the −Y direction side.

As illustrated in FIG. 20, the parabolic mirror 2d has the second reflective surface 22d instead of the second reflective surface 22c of the parabolic mirror 2c. The second reflective surface 22d includes a third region 22ad and a fourth region 22bd. The second reflective surface 22d has a parabolic surface shape protruding toward the −Z direction side in the X direction.

A focal point Fc1 of the first region 21ac overlaps a focal point Fd3 of the third region 22ad. In other words, the focal point Fc1 is located at substantially the same position as the focal point Fd3. Thus, the laser beam 50c reflected by the first region 21ac toward the third region 22ad is substantially collimated by reflection by the third region 22ad, and then emitted through the emission surface 23.

The focal point Fc2 of the second region 21bc overlaps with a focal point Fd4 of the fourth region 22bd. In other words, the focal point Fc2 is located at substantially the same position as the focal point Fd4. Therefore, the laser beam 50d reflected by the second region 21bc toward the fourth region 22bd is substantially collimated by reflection by the fourth region 22bd, and then emitted through the emission surface 23. Note that the focal point Fc1 of the first region 21ac does not overlap with the focal point Fc2 of the second region 21bc.

In the shape of the parabolic mirror 2d having such a second reflective surface 22d, the same effects as the parabolic mirror 2c can also be obtained.

In the present embodiment, the configuration is illustrated in which the first reflective surface 21c and the second reflective surface 22c each have two regions, but are not limited thereto. The first reflective surface 21c may include three or more regions having different focal points, and the second reflective surface 22c may include three or more regions having different focal points. In this case also, the laser beam 50 emitted from the one light-emitting portion 113 is reflected by one region in the first reflective surface 21c, and then substantially collimated by being reflected by one region in the second reflective surface 22c that corresponds to one region in the first reflective surface 21c in a one-to-one manner.

Third Embodiment

Subsequently, a light source device 100e and a light source device 100f according to a third embodiment will be described. The light source device 100e is a first example of the third embodiment, and the light source device 100f is a second example of the third embodiment.

Figure 21:
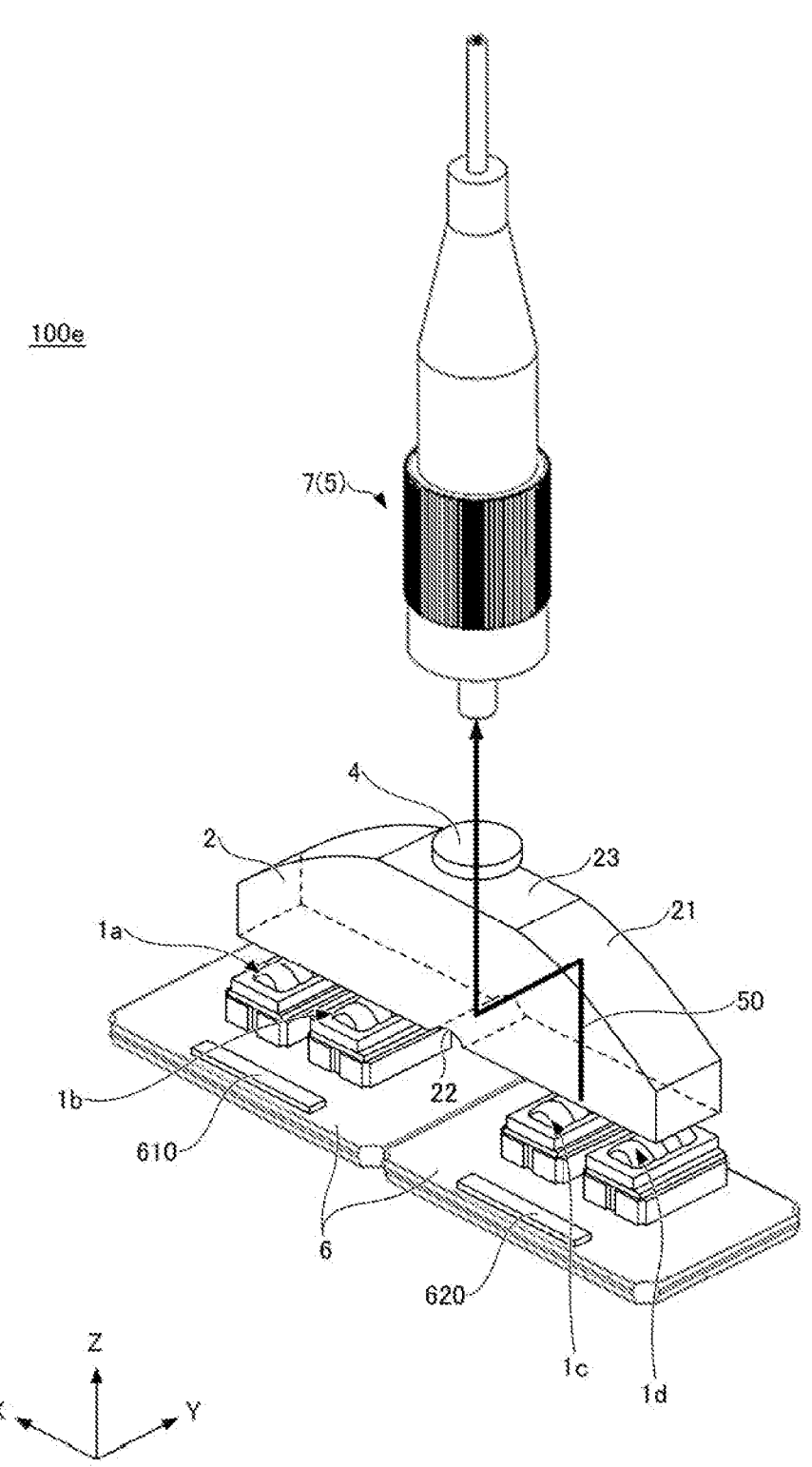
FIG. 21 is a perspective view of a first example of a configuration of a light source device according to a third embodiment.

FIG. 21 is a perspective view illustrating a configuration of the periphery of the parabolic mirror 2 in the light source device 100e. As illustrated in FIG. 21, in the light source device 100e, the laser beam 50 emitted from the array light-emitting portion 1 is reflected by the first reflective surface 21 of the parabolic mirror 2 and reflected by the second reflective surface 22, and then exits in the +Z direction through the emission surface 23. The laser beam 50 emitted from the emission surface 23 is condensed by the condenser lens 4, and is incident on the core of the optical fiber 5 held by the optical connector 7.

In the present embodiment, the parabolic mirror 2 corresponds to one optical member, and the +Z direction in which the parabolic mirror 2 reflects the laser beam 50 corresponds to the predetermined direction.

In other words, the light source device 100e does not include the stepped mirror 3 in the first embodiment, and emits the laser beam 50 in the +Z direction by the parabolic mirror 2 corresponding to the one optical member. According to this configuration, in the plurality of laser beams 50 emitted by the plurality of light-emitting portions 113, the entire width Wx2 can be smaller than the entire width Wx1 (see FIG. 7), and the beam width D2 of the laser beam 50 can be smaller than the beam width D1 (see FIG. 10). As a result, the aberration can be suppressed and the light condensing properties of the laser beam 50 can be improved, and the light source device 100 having good light condensing properties with respect to the laser beam 50 from the plurality of light-emitting portions 113 can be provided.

Figure 22:
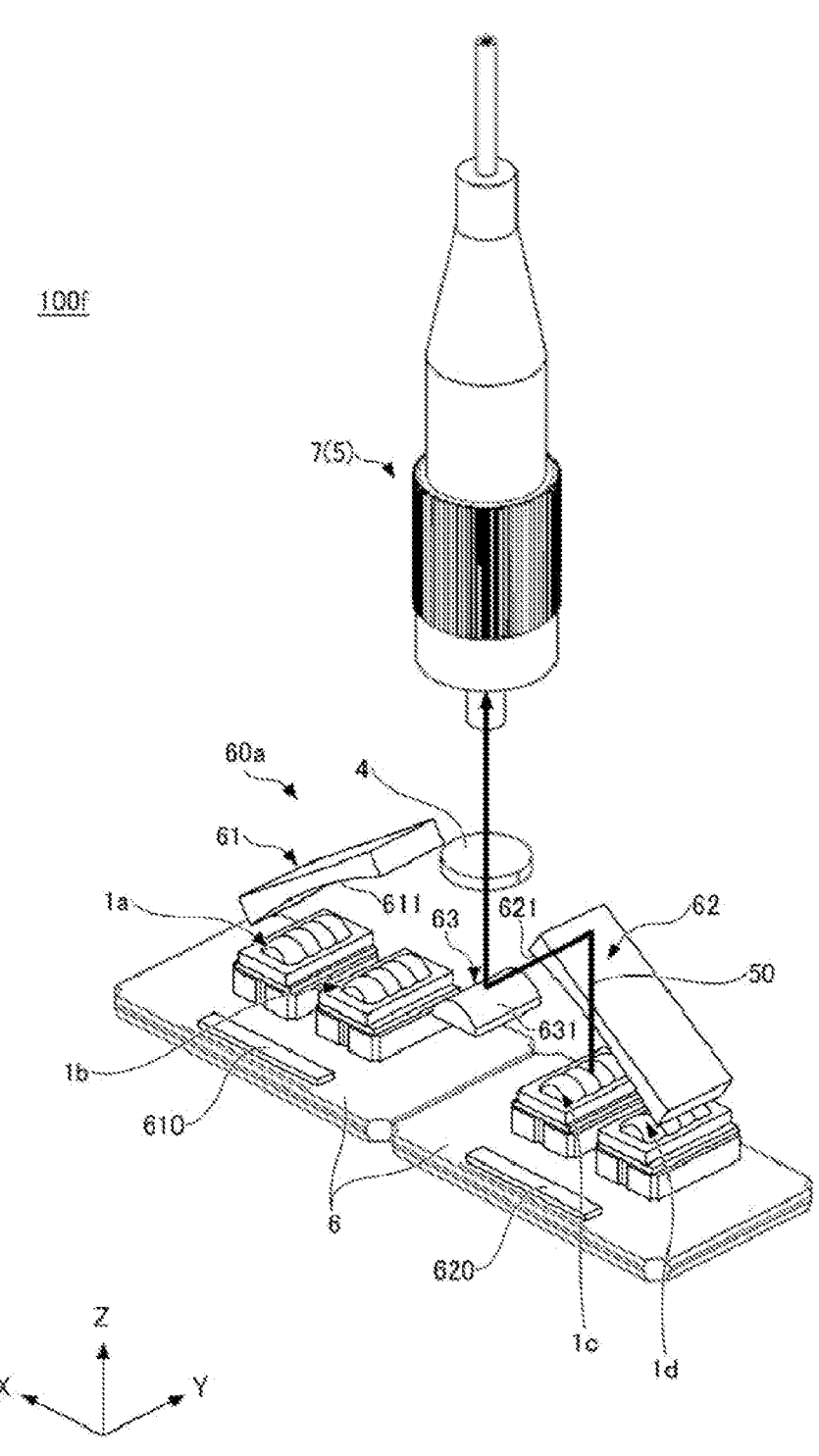
FIG. 22 is a perspective view of a second example of the configuration of the light source device according to the third embodiment.

On the other hand, FIG. 22 is a perspective view illustrating a configuration of the periphery of the optical member group 60a in the light source device 100f. As illustrated in FIG. 22, in the light source device 100f, the laser beam 50 emitted from the array light-emitting portion 1 is reflected by the fourth reflective surface 621 of the second parabolic surface member 62, and then is reflected by the fifth reflective surface 631 of the third parabolic surface member 63 and incident on the condenser lens 4. The laser beam 50 condensed by the condenser lens 4 is incident on the core of the optical fiber 5 held by the optical connector 7.

In the present embodiment, the optical member group 60a corresponds to the plurality of optical members, and the +Z direction in which the optical member group 60a emits the laser beam 50 corresponds to the predetermined direction.

In other words, the light source device 100f does not include the stepped mirror 3 in the first embodiment, and emits the laser beam 50 in the +Z direction by the first parabolic surface member 61, the second parabolic surface member 62, and the third parabolic surface member 63 corresponding to the plurality of optical members. With this configuration, the same effect as that of the light source device 100e can be obtained.

While certain embodiments and modification examples have been described above, the embodiments disclosed in the present invention are illustrative and not intended to be restrictive in all respects. The scope of the present invention is intended to include all changes within the scope and scope of the claims that are indicated by the claims and are equivalent to the claims.

The number, quantity, etc. used in the description of the embodiments all are illustrated to specifically describe the technology of the present invention, and the present invention is not limited to the numbers illustrated.

The light source device in the embodiment can be utilized in high brightness lighting, projector, display, headlights, head-mounted display, etc.

What is claimed is:

1. A light source device comprising:
a plurality of light-emitting portions arranged along an arrangement direction and an orthogonal direction that is orthogonal to the arrangement direction;
one or more optical members comprising a first reflective surface, a second reflective surface, and a stepped reflective surface, wherein the one or more optical members are configured to reflect light emitted from the plurality of light-emitting portions and emit the light in a predetermined direction; and
a condenser lens configured to condense the light emitted from the one or more optical members; wherein:
the first reflective surface is configured to reflect the light emitted from the plurality of light-emitting portions toward the second reflective surface;
the second reflective surface is configured to reflect the light reflected by the first reflective surface;
the stepped reflective surface is configured to reflect the light reflected by the second reflective surface toward the condenser lens;
each of the first reflective surface and the second reflective surface is a surface having a curvature in the arrangement direction and having substantially no curvature in the orthogonal direction; and
the curvature of the second reflective surface in the arrangement direction is greater than the curvature of the first reflective surface in the arrangement direction;
the stepped reflective surface comprises a plurality of stepped surfaces having different heights, each of the plurality of stepped surfaces corresponds to a respective light beam array among a plurality of light beam arrays arranged along the orthogonal direction, and is configured to reflect the respective light beam array; and
each of the plurality of light beam arrays comprises a plurality of the light beams reflected by the second reflective surface and arranged along the arrangement direction.

2. The light source device according to claim 1, wherein:
a focal point in at least a portion of the first reflective surface overlaps with a focal point in at least a portion of the second reflective surface.

3. The light source device according to claim 1, wherein:
the plurality of light-emitting portions comprises a first light-emitting portion and a second light-emitting portion;
the first reflective surface comprises a first region configured to reflect a light beam emitted from the first light-emitting portion, and a second region configured to reflect a light beam emitted from the second light-emitting portion;
the second reflective surface comprises a third region configured to reflect the light beam emitted from the first light-emitting portion and reflected by the first reflective surface, and a fourth region configured to reflect the light beam emitted from the second light-emitting portion and reflected by the first reflective surface;
a focal point of the first region overlaps with a focal point of the third region; and
a focal point of the second region overlaps with a focal point of the fourth region.

4. The light source device according to claim 1, wherein:
each of the plurality of light-emitting portions is configured to emit a laser light beam;
a width along the arrangement direction of a laser light beam emitted each light-emitting portion is smaller at a position where the laser light beam is reflected by the second reflective surface than at a position where the laser light is incident on the first reflective surface; and
an interval between a plurality of the laser light beams emitted from the plurality of light-emitting portions is smaller in the predetermined direction at a position where the laser light beams are reflected by the stepped reflective surface than in the orthogonal direction at a position where the laser light is incident on the stepped reflective surface.

5. The light source device according to claim 1, wherein:

the one or more optical members comprise a plurality of optical members; and the plurality of optical members comprise:

a first optical member integrally comprising the first reflective surface and the second reflective surface, and a second optical member comprising the stepped reflective surface.

6. The light source device according to claim 1, wherein:

the one or more optical members comprise a single optical member that integrally comprises the first reflective surface, the second reflective surface, and the stepped reflective surface.

7. The light source device according to claim 1, further comprising:

an optical fiber comprising a core and a cladding that covers the core; wherein:

the light condensed by the condenser lens is incident on the core of the optical fiber.

8. The light source device according to claim 1, wherein each of the first reflective surface and the second reflective surface has a shape of a portion of a cylindrical surface.

\* \* \* \* \*